US008688280B2

(12) United States Patent
Macey

(10) Patent No.: US 8,688,280 B2
(45) Date of Patent: Apr. 1, 2014

(54) INTERNET BASED SPA NETWORKING SYSTEM HAVING WIRELESS SPA NODES

(75) Inventor: Stephen S. Macey, Oceanside, CA (US)

(73) Assignee: Watkins Manufacturing Corporation, Vista, CA (US)

( * ) Notice: Subject to any disclaimer, the term of this patent is extended or adjusted under 35 U.S.C. 154(b) by 160 days.

(21) Appl. No.: 13/220,938

(22) Filed: Aug. 30, 2011

(65) Prior Publication Data
US 2012/0078426 A1  Mar. 29, 2012

Related U.S. Application Data

(60) Provisional application No. 61/378,339, filed on Aug. 30, 2010.

(51) Int. Cl.
| G01R 21/06 | (2006.01) |
| G05B 11/01 | (2006.01) |
| G05B 15/00 | (2006.01) |
| G05B 15/02 | (2006.01) |
| G05B 19/18 | (2006.01) |
| G05B 23/02 | (2006.01) |
| G05D 11/00 | (2006.01) |
| G06F 11/00 | (2006.01) |

(52) U.S. Cl.
USPC ........ 700/286; 700/2; 700/9; 700/19; 700/20; 700/275; 700/291; 340/3.1; 702/62; 702/188

(58) Field of Classification Search
USPC ............... 700/2, 9, 19, 20, 275, 286, 291; 340/3.1; 702/62, 188
See application file for complete search history.

(56) References Cited

U.S. PATENT DOCUMENTS

| 3,781,925 | A | * | 1/1974 | Curtis et al. ................ 4/493 |
| 4,322,297 | A | * | 3/1982 | Bajka ........................ 210/742 |
| 5,117,233 | A | * | 5/1992 | Hamos et al. ............ 340/12.22 |
| 5,361,215 | A | * | 11/1994 | Tompkins et al. ........... 700/300 |
| 5,422,014 | A |   | 6/1995 | Allen et al. |
| 5,436,510 | A | * | 7/1995 | Gilbert ........................ 307/38 |
| 5,917,405 | A |   | 6/1999 | Joao |
| 5,956,487 | A |   | 9/1999 | Venkatraman et al. |
| 6,363,422 | B1 | * | 3/2002 | Hunter et al. ............... 709/224 |
| 6,516,070 | B2 |   | 2/2003 | Macey |

(Continued)

OTHER PUBLICATIONS

Form PCT/ISA/210 in connection with PCT/US2011/049782 dated Mar. 22, 2012.

(Continued)

Primary Examiner — Mohammad Ali
Assistant Examiner — Jennifer L Norton
(74) Attorney, Agent, or Firm — Greenberg Traurig LLP; Franklin D. Ubell

(57) ABSTRACT

A spa node comprising a spa controller, a power sense adapter configured to compute power being drawn by selected spa components; a spa network adapter, and a home network adapter, each of the three adapters including a wireless transceiver wherein the spa network adapter is configured to receive power data transmitted over a wireless link by the power sense adapter and to further receive status/performance data from the spa controller. The home network adapter is configured to receive power and status data transmitted by the spa network adapter over a wireless link and to convert that data to a form suitable for transmission to an Internet access point. The home network adapter is further linkable over the Internet to a central server, a dealer computer and a spa owner or user computer.

14 Claims, 34 Drawing Sheets

(56) References Cited

U.S. PATENT DOCUMENTS

| | | |
|---|---|---|
| 6,788,980 B1 | 9/2004 | Johnson |
| 7,167,087 B2 * | 1/2007 | Corrington et al. ........... 340/505 |
| 7,292,898 B2 | 11/2007 | Clark |
| 7,398,138 B2 | 7/2008 | Emery |
| 7,412,206 B1 | 8/2008 | Hutchings et al. |
| 7,489,986 B1 | 2/2009 | Laflamme |
| 2002/0035403 A1 * | 3/2002 | Clark et al. ..................... 700/65 |
| 2003/0171111 A1 | 9/2003 | Clark |
| 2007/0239317 A1 * | 10/2007 | Bogolea et al. ............... 700/276 |
| 2008/0039977 A1 | 2/2008 | Clark |
| 2009/0055032 A1 * | 2/2009 | Rodgers ........................ 700/295 |
| 2009/0132066 A1 | 5/2009 | Hollaway |
| 2009/0259346 A1 * | 10/2009 | Reed et al. .................... 700/295 |
| 2011/0202189 A1 * | 8/2011 | Venkatakrishnan et al. .. 700/286 |

OTHER PUBLICATIONS

Form PCT/ISA/237 in connection with PCT/US2011/049782 dated Mar. 22, 2012.

* cited by examiner

INTERNET BASED SPA NETWORKING SYSTEM HAVING WIRELESS SPA NODES

RELATED APPLICATIONS

This application claims the benefit of and priority to U.S. Provisional Application Ser. No. 61/378,339, filed Aug. 30, 2010, entitled, "Internet Based Spa Networking System Having Wireless Spa Nodes," the contents of which are incorporated by reference herein in its entirety.

BACKGROUND

1. Field

The subject disclosure relates to systems for monitoring and controlling various parameters related to the operation of portable spas, tubs, and the like, and more particularly to a system featuring a wireless spa node and Internet based control system linking spa owners/users and spa dealers to the wireless spa node.

2. Related Art

Portable spa have become quite popular as a result of their ease of use and multiplicity of features such as varied jet and seating configurations. One area where the inventor has recognized that ease of use could be enhanced is the area of monitoring and controlling spa operation both from a user and dealer standpoint.

SUMMARY

The following is a summary description of illustrative embodiments of the invention. It is provided as a preface to assist those skilled in the art to more rapidly assimilate the detailed design discussion which ensues and is not intended in any way to limit the scope of the claims which are appended hereto in order to particularly point out the invention.

In an illustrative embodiment, a spa controller is configured to control operation of a plurality of spa components and to generate data regarding the status and/or performance of such components. The controller comprises part of a spa node further comprising a power sense adapter configured to compute power being drawn by selected spa components; a spa network adapter, and a home network adapter, each of the three adapters including a wireless transceiver. The spa network adapter is configured to receive power data transmitted over a wireless link by the power sense adapter and to further receive status/performance data from the spa controller. The home network adapter is configured to receive power and status data transmitted by the spa network adapter over a wireless link and to convert that data to a form suitable for transmission to an Internet access point. The home network adapter is further linkable over the Internet to a central server, a dealer computer and/or spa owner or user computer.

DRAWINGS

DETAILED DESCRIPTION

Figure 1:
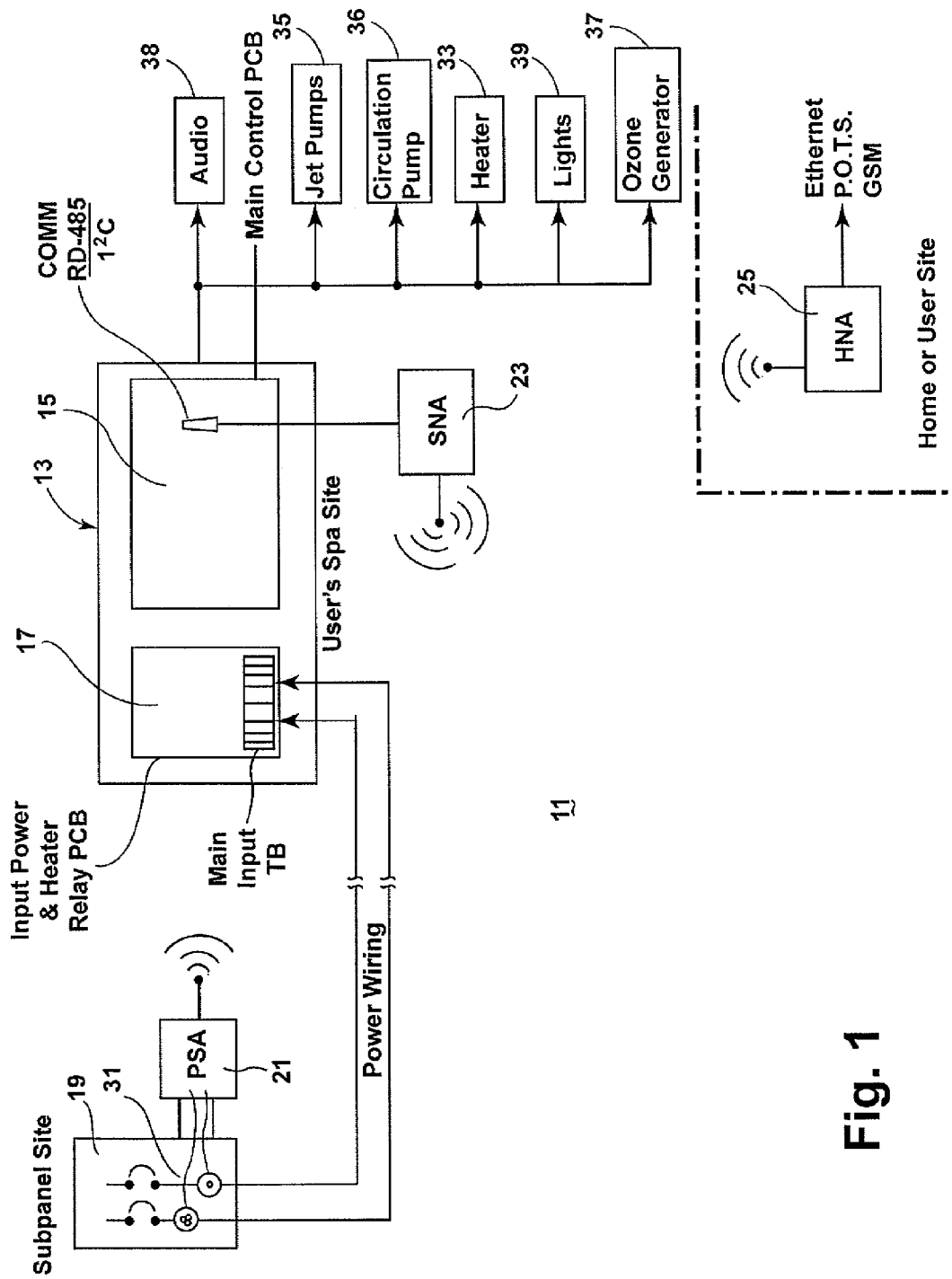
FIG. 1 is a system block diagram of an illustrative embodiment.

An illustrative embodiment is shown in FIG. 1. It includes a spa controller 13, which in an illustrative embodiment includes a main control printed circuit board (PCB) 15 and an input power PCB 17. The system further includes a power subpanel or breaker box 19, a cooperating power sense adapter (PSA) 21, a spa network adapter (SNA) 23, and a home network adapter (HNA) 25. The components shown in FIG. 1 are all typically located in the immediate vicinity of a home or other site where a spa is located and may be collectively referred to as a "spa node."

In an illustrative embodiment, the SNA 23 and HNA 25 each include a wireless transceiver, which in an illustrative embodiment is a ZigBee/802.15.4 transceiver, for example, such as an MRF 24 J40 MB transceiver module as available from Microchip Technology Inc. The SNA 23 and HNA 25 each also include a microcontroller for coordinating, sequencing, and controlling their operation. In one embodiment, the microcontroller may be a 32-bit flash microcontroller such as the Microchip Technology PIC32MX. The PSA 21 may comprise an Ember EM250 chip, which includes a ZigBee transceiver and a 16 bit microprocessor. Thus, the PSA 21 and SNA 23 are configured to communicate with one another wirelessly over a wireless channel or channels, as are the SNA 23 and HNA 25.

In one aspect of operation, power is supplied to the spa from an interconnection between a subpanel 19 and the input power PCB 17. Current transformers 31 provide current sense signals to the PSA 21. The PSA 21 also monitors the voltage across each subpanel circuit conductor pair and computes the power drawn from each subpanel circuit, applying power factor compensation. The PSA 21 may then transmit the compensated power data to the SNA 23 utilizing a wireless link between their two wireless transceivers.

The SNA 23 also receives other data regarding spa status and operating conditions from the spa controller 13 and transmits such data along with power data wirelessly to the HNA 25 over a link between their respective wireless transceivers. In one embodiment, the HNA 25 then converts the data to a format such as Fast Ethernet suitable for communication to a device adapted for Internet transmission, e.g., such as a home computer, telephone modem or router. Table 1 below is a data map illustrating spa system status and performance parameters which may be transmitted by the SNA 23 through the HNA 25 to the central server 111 in one illustrative embodiment.

The spa controller 13 may include one or more microprocessors or microcontrollers as well as fault detection hardware, which may receive inputs from a high limit temperature sensor, a temperature regulation sensor, and a pressure regulation sensor. The controller 13 may further be configured to switch on or off a spa water heater 33, one or more jet pumps 35, a circulation pump 36, an ozone generator 37, an audio system 38, and/or spa lights and external lighting 39.

In one embodiment of a subpanel-to-spa power connection, 20 amp and 30 amp two pole A.C. breaker circuits are provided. In this embodiment, the 30 amp A.C. circuit supplies two jet pumps and other spa equipment, while the 20 amp A.C. circuit is dedicated solely to the spa electrical resistance heater 33, which may be, for example, a 4 KW heater. Four current transformers 31 may be used to respectively monitor the 20 amp circuit and the 30 amp circuit. A third measurement is also made for the parallel circuit comprising one or more jet pumps 35 and other spa equipment, e.g., 36, 37, 38, 39.

Employing such an embodiment, a number of power measurements may be made. For example, if one of the jet pumps 35 is "on", the current transformers 31 may report 10 amps being drawn by the "on" jet pump, while a "to ground" measurement yields 12.2 amps. Taking the difference yields 2.2 amps being drawn by the remainder of the active spa equipment, i.e., equipment which is in the "on" state.

Figure 2:
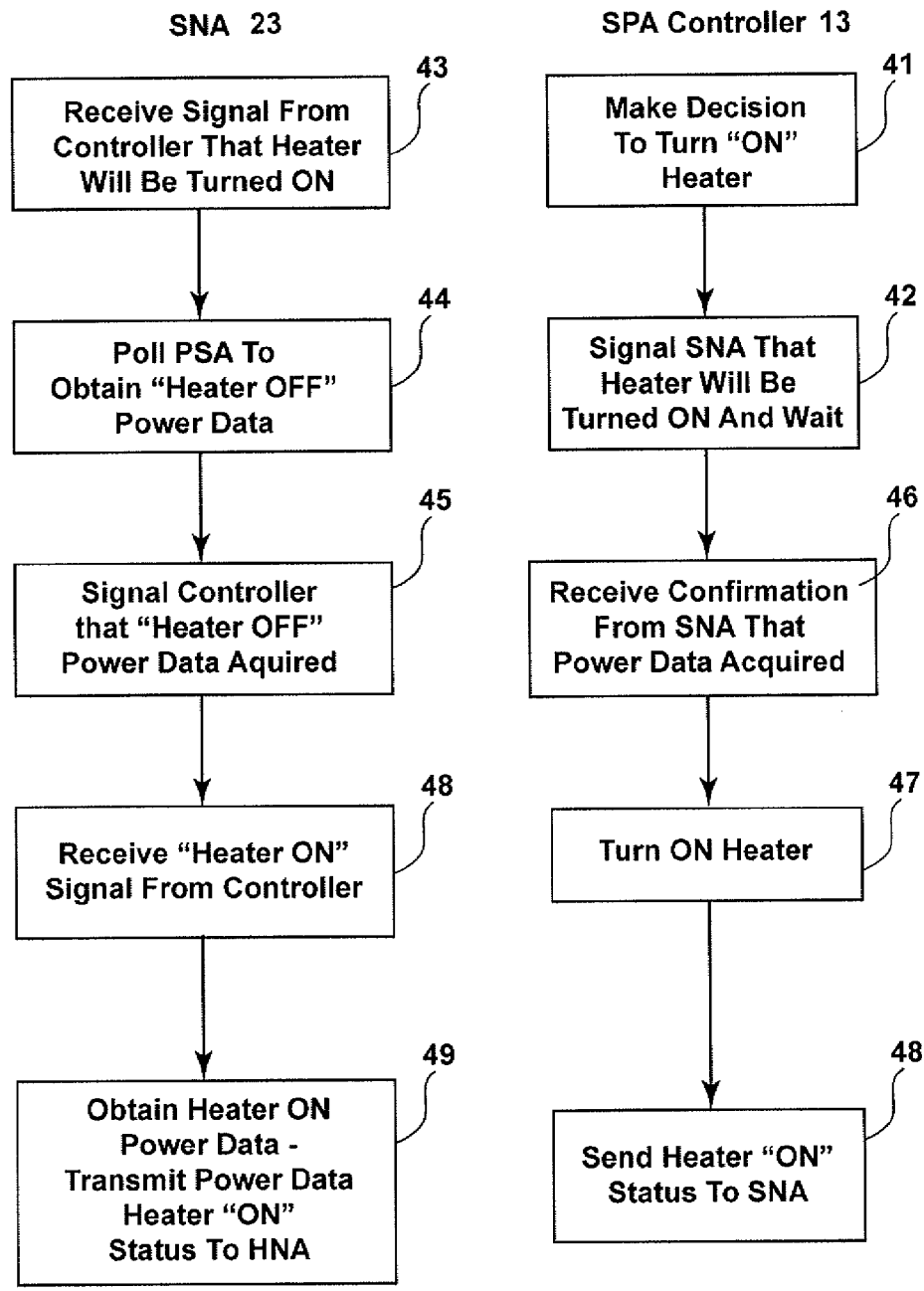
FIG. 2 is a flow chart illustrating operation of an illustrative embodiment.

In one embodiment, the spa controller 13 signals the SNA 23 that it is about to turn "on" a selected spa equipment component. The SNA 23 then communicates with the PSA 21 to cause the PSA 21 to sense the incremental increase in power drawn by that component. For example, as shown in FIG. 2, in steps 41, 42, the controller 13 may decide to turn "on" the heater 33 and then signals the SNA 23 that it is about to turn on the heater 33, which signal is received by the SNA in step 43. The SNA 23 then alerts the PSA 21, in step 44, to take "before" and "after" readings to determine the power supplied to the heater 37. If the heater 33 is later turned off, the SNA 23 may poll the PSA 21 again. The SNA 23 may then signal the controller 13 that "Heater Off" power data has been acquired in step 45 and that signal is received by the controller 13 at step 46. In the steps 47 and 48, the controller 13 turns on the heater 33 and signals the SNA 23 that it has turned on the heater 33. The SNA 23 then obtains the "Heater On" power data and transmits that power data to the HNA 25. In one embodiment, the HNA 25 then transmits the power data to the server/database 111 of FIG. 3, for example, for subsequent display to the spa user or to the dealer who sold the spa to the user, as subsequently discussed in more detail.

Similarly, in one embodiment, if a jet pump is to be turned on, the SNA 23 may then poll the PSA 21 for a power reading. Thus, a programmed generation and exchange of power data is accomplished through the interaction of the spa controller 13, and the wirelessly coupled PSA 21 and SNA 23. The PSA 21 may further be programmed to periodically sample and store selected power data and to respond by transmitting such data to the SNA 23 when polled by SNA 23, which may operate in a periodic polling mode. The PSA 21 may further be programmed to clear its memory after a certain point to avoid data overflow.

Figure 3:
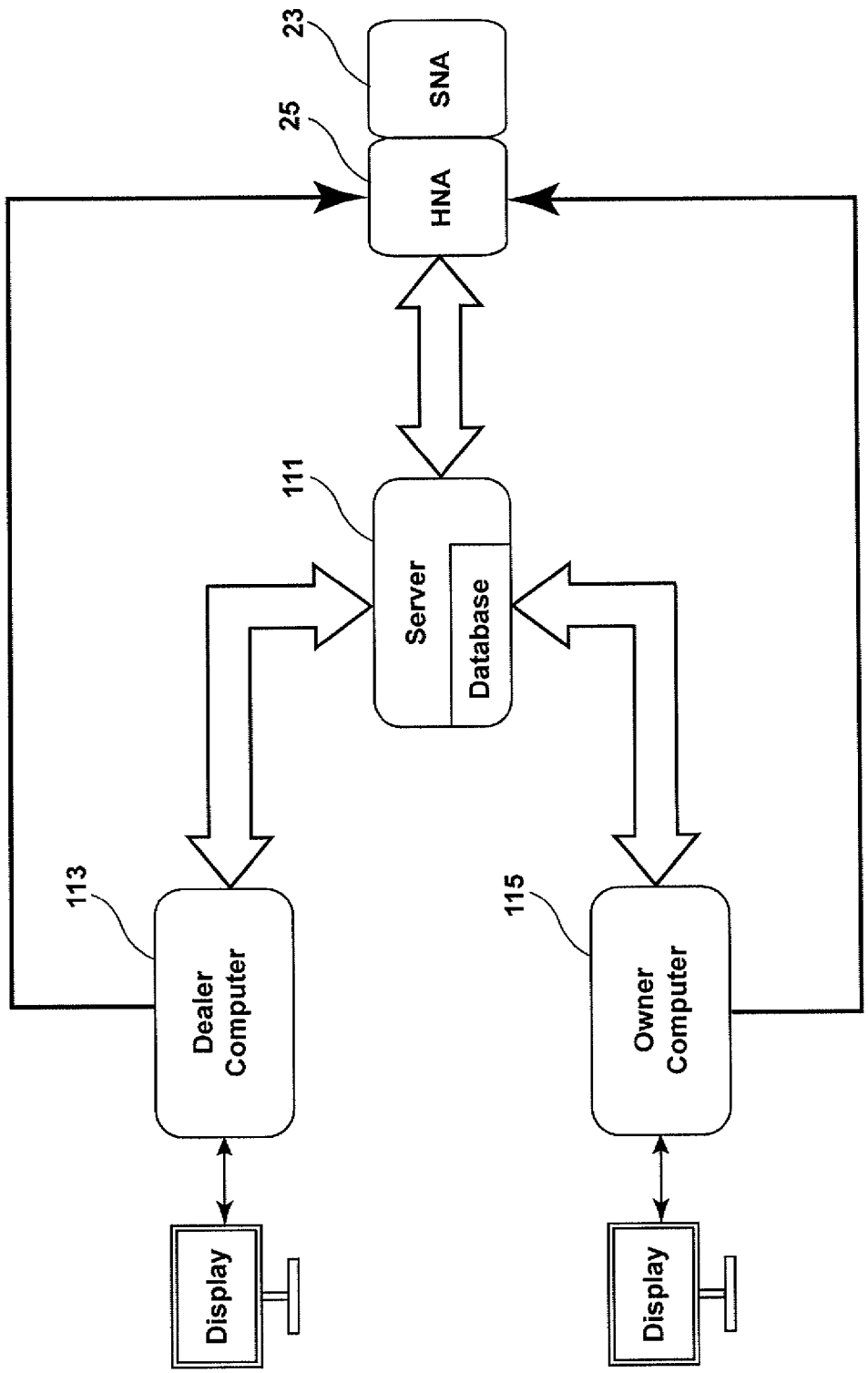
FIG. 3 is a system block diagram of one embodiment of an Internet based system for storing and distributing spa status information.

FIG. 3 is a system diagram of an Internet based system for storing and distributing status information which has been sent by the SNA 23 to the HNA 25. This system comprises a central server 111, a spa dealer computer 113, a homeowner computer 115, a home network adaptor (HNA) 25 and a spa network adapter (SNA) 23. In the system of FIG. 3, each spa has a unique Internet Protocol (IP) address, as does each dealer computer and homeowner computer. In one embodiment, there would be many homeowner computers and dealer computers. In various embodiments, the homeowner and dealer may access the system using any one of many known access devices such as personal computers or handheld devices.

In the system of FIG. 3, the dealer computer 113 and the homeowner computer 115 each may access the central server 111 to view system status and configuration information. Either the dealer or homeowner computer 113, 111 may transmit commands to the HNA 25 for subsequent transfer to the SNA 23 and then to the spa controller 13. Such commands may include "jet pump on/off," "blower on/off" and "lighting control" commands. In one embodiment, such control commands for the spa equipment are only transmitted directly from the dealer or homeowner computer (or web access device) to the homeowner's Internet Access Point, then to the HNA 25, then to the SNA 23, and then to the spa controller 13.

As an example of operation, assume that a spa owner "clicks" on a graphic button on a web page displayed on his or her home computer in order to turn the spa jets on. The web page contains programming which responds to the user action by causing a "turn jets on" command to be routed to the IP Address associated with the homeowner's specific HNA 25. This specific HNA 25 receives the command, and the SNA 23 is advised and sends the command to the spa controller 13, which responds to the command by turning on the spa jets.

The spa controller 13 then sends data to the SNA 23 confirming that the jet pump has been turned on. The SNA 23 makes a Power Data Request to the power sense adapter (PSA) 21 and receives power data. The jet pump's operating data and the power data are then sent to the HNA 25, which forwards this data, along with its own identification data to the central server 111, which then updates its data base for that particular homeowner's spa. Should the homeowner or dealer thereafter access that spa's web page from the central server 111, the database fills in the page's graphics with the latest updated data.

System status information and performance factors which may be transmitted to the central servicer in one embodiment are illustrated in the data map of Table I below:

TABLE 1

| Data Map # | Data Paint | Description |
| --- | --- | --- |
| 01 | Jets 1 hour of service | Cumulative time of Jet Pump 1 Relay closed - Resettable |
| 02 | Jets 2 hours of service | Cumulative time of Jet Pump 2 Relay closed - Resettable |
| 03 | Jets 3 hours of service | Cumulative time of Jet Pump 3 Relay closed - Resettable |
| 04 | Control hours of service | Cumulative time of Spa Control Power On - Resettable |
| 05 | Heater hours of service | Cumulative time of Heater Relay closed - Resettable |
| 06 | Grand Total Jet hours | |
| 07 | Grand Total Jet hours | |
| 08 | Grand Total Jet hours | |

TABLE 1-continued

| Data Map # | Data Point | Description |
|---|---|---|
| 09 | Jet pump 1 High current sense | Value in Amps |
| 10 | Jet pump 1 Low current sense | Value in Amps |
| 11 | Jet pump 2 High current sense | Value in Amps |
| 12 | Jet pump 1 Low current sense | Value in Amps |
| 13 | Jet pump 3 High current sense | Value in Amps |
| 14 | Jet pump 3 Low current sense | Value in Amps |
| 15 | Heater current sense | Value in Amps |
| 16 | Blower current sense | Value in Amps |
| 17 | Monthly Energy | Value in Watts accumulated from PSA |
| 18 | Yearly | Value in Watts accumulated from PSA |
| 19 | Grand Total | Value in Watts accumulated from PSA |
| 20 | Total input power | Calculated value in watts from Power Sense Assembly Data |
| 21 | Average A/C Voltage | Value in Volts acquired by PSA |
| 22 | Peak A/C Voltage | Value in Volts acquired by PSA |
| 23 | Lowest A/C Voltage | Value in Volts acquired by PSA |
| 24 | Average DC Voltage | |
| 25 | Peak DC Voltage | |
| 26 | Lowest DC Voltage | |
| 27 | Error Data | Error Code Data |
| 28 | Power loss count | On/Off |
| 29 | Clear Error Codes | |
| 30 | Heater state | Monitors Heater On/Off |
| 31 | Jet 1 State | High, Low, Off |
| 32 | Jet 2 State | High, Low, Off |
| 33 | Jet 3 State | High, Low, Off |
| 34 | Light intensity | Status Value |
| 35 | Light Color | Status Value |
| 36 | Light Wheel Speed | Status Value |
| 37 | Circ Pump State | Monitors Circ Pump Relay On/Off |
| 38 | Blower state | Monitors Blower Relay On/Off |
| 39 | Set temperature | Stored Value I Degrees |
| 40 | Regulating Temperature data | Control Sensor Value in Degrees |
| 41 | Limiting Temperature data | Control Sensor Value in Degrees |
| 42 | Peripheral status | Status as reported to active peripheral address: Enabled/Disabled |
| 43 | Ozone state | Monitors Ozone Relay On/Off |
| 44 | SmartBreaker | On/Off (Future) |
| 45 | Clean Mode | On/Off, Settable |
| 46 | Summer Timer mode | On/Off, Settable |
| 47 | Sleep Mode | On/Off, Settable |
| 48 | Water Treatment state | On/Off - Error Status |
| 49 | | |
| 50 | | |

Such data may then be used to populate various items in the display or compute values for display.

FIGS. 4-7 illustrate one embodiment web pages which may be provided to a homeowner computer 115 by the central server 111 to provide spa system status information to the homeowner/user, while FIGS. 8-11 illustrate one embodiment web pages which may be provided by the central server 111 to a spa dealer to allow the dealer to monitor the spa status and perform diagnostics. Such a system may be of great advantage to spa dealers, for example, in reducing the number of, and/or eliminating, maintenance trips to the user/homeowner's site/home. The user and dealer web pages will now be described in more detail.

Figure 4:
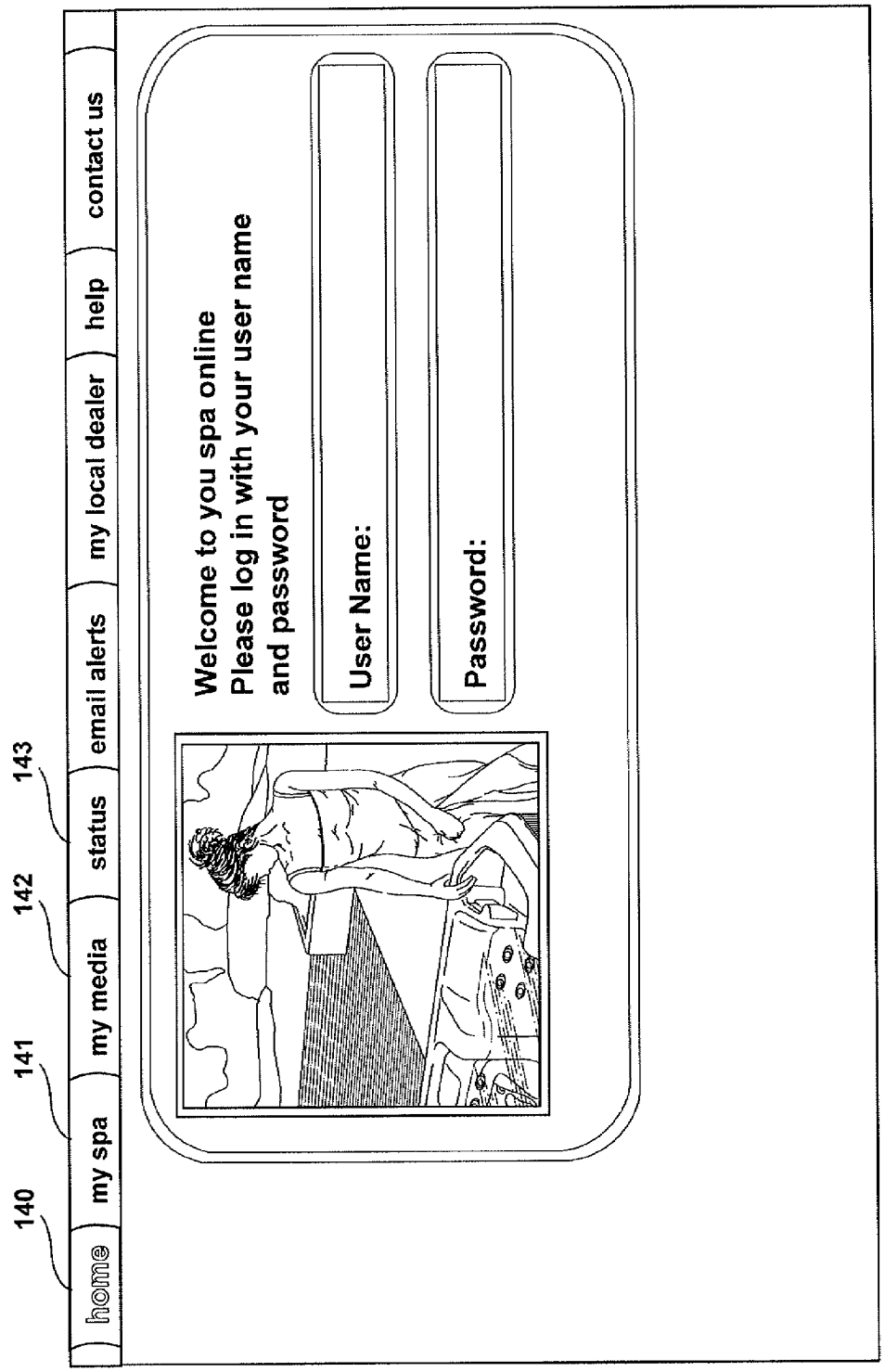
FIGS. 4-7 illustrate web pages which may be provided by a central server to a homeowner computer according to one illustrative embodiment.

FIG. 4 illustrates a user log-in webpage where the user may enter his name and password to gain access to the system. Performance of a selection operation such as clicking or touching on one of the links, e.g., 140, 141, 142, 143, across the top of the page such as "my spa" 141, "my media" 142, status 143, etc., allows access to other web pages.

Figure 5:
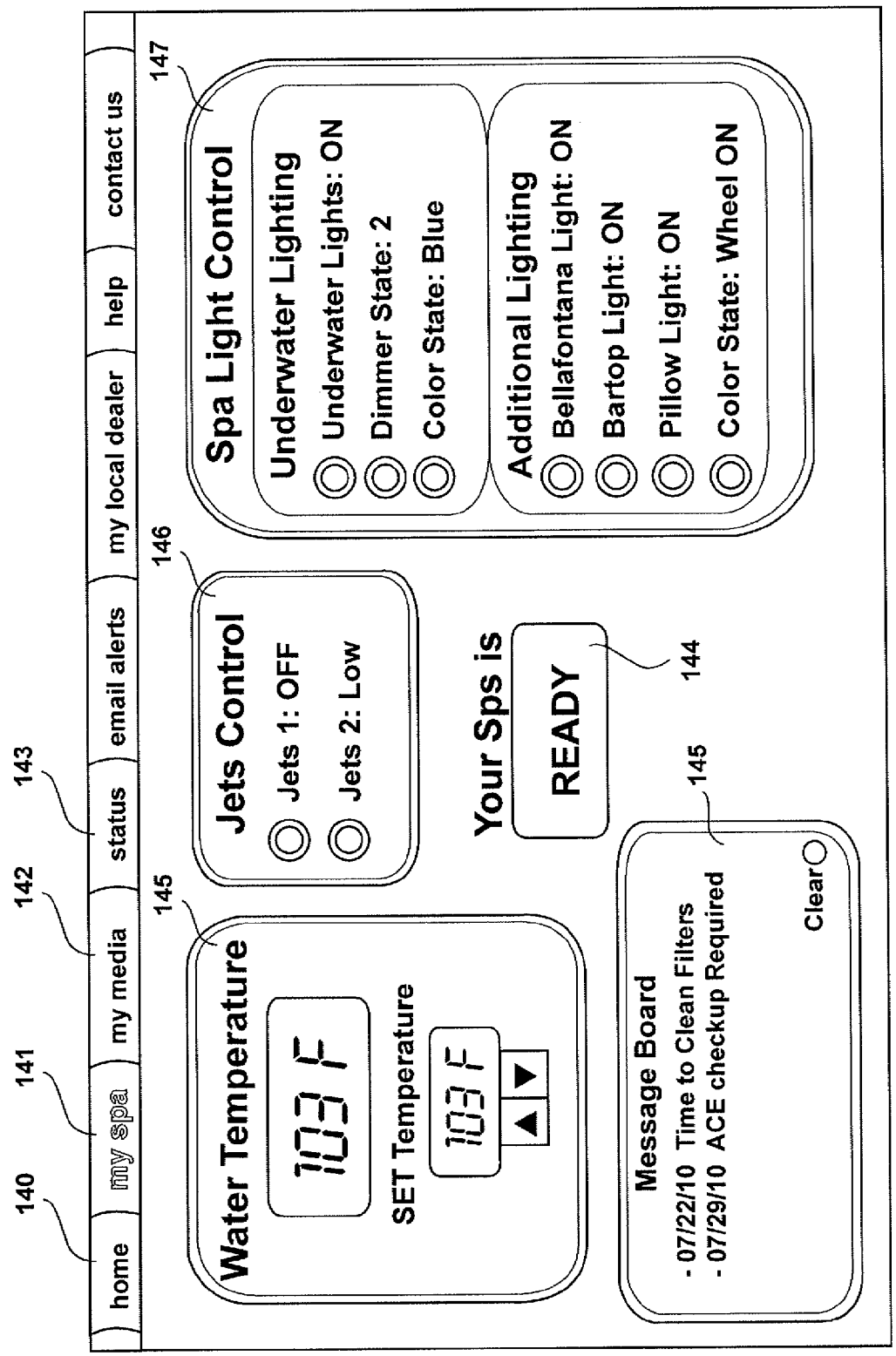

FIG. 5 illustrates the display screen generated when the "my spa" link 141 is selected by the user. The display screen provides display areas 145, 146, 147 which enable the user to view the spa water temperature, set the spa water temperature, view the status of the jets, turn the jets on or off or set jet speed, and control various spa lighting features by either turning them on or off. A spa ready message 144 may also be provided to indicate that the spa is ready for use and add the set temperature. A message board display 145 may also be provided where the system advises the user that, for example, it is time to clean the spa filters or that maintenance of the spa sanitation system ("ACE") is required.

Figure 6:
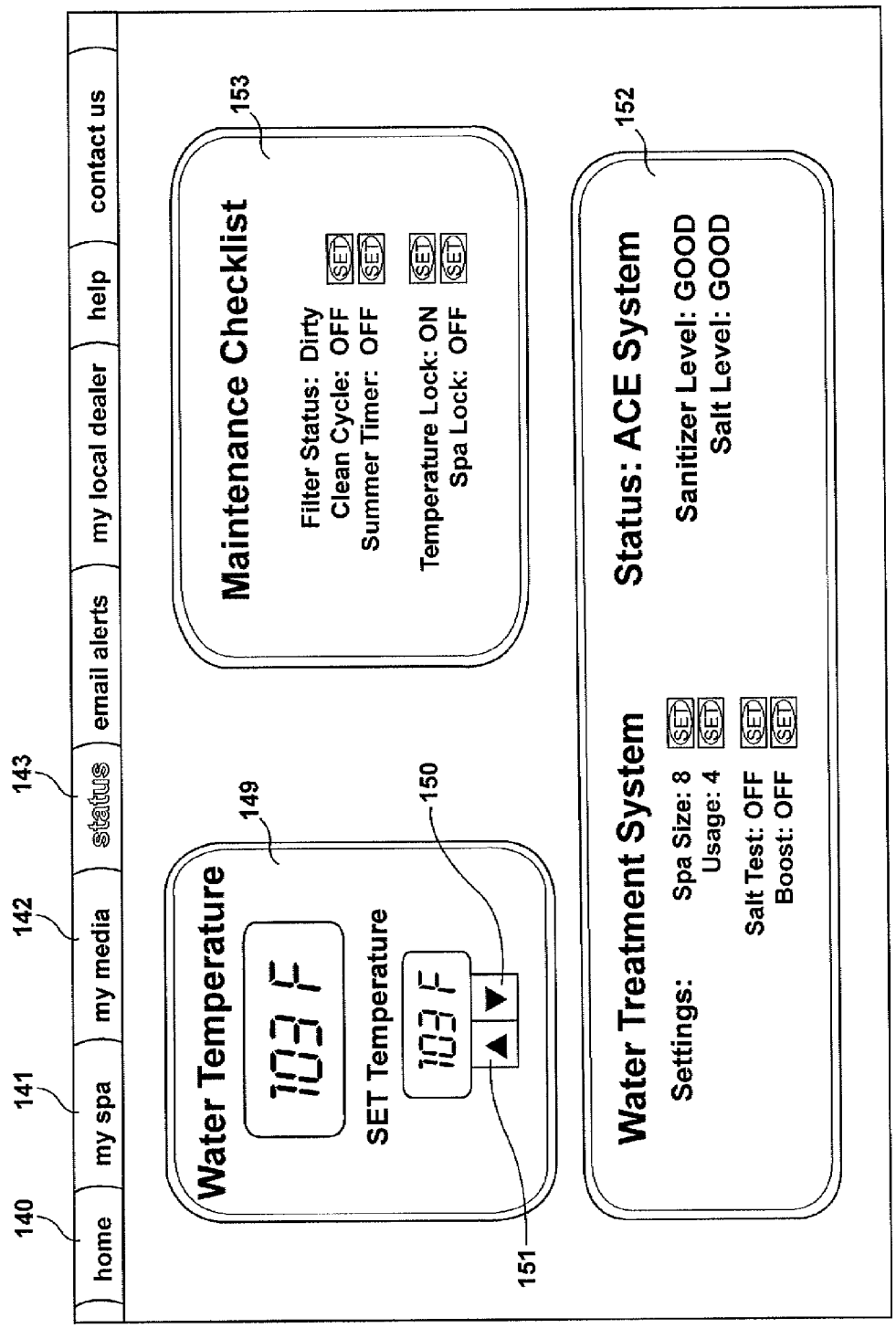

FIG. 6 shows an illustrative status screen presented to the user when the user selects the status link 143. In the screen of FIG. 6, a temperature display 149 is provided telling the user of the temperature of the spa water and allowing the user to set the temperature either up or down via point/click or a touch operation, for example, on up/down arrows 150, 151. A water treatment system display 152 also allows the user to set various parameters used to control the spa's water treatment system, for example, spa size and usage levels, or select a boost mode or a salt test mode. The status of the sanitizer level and salt level may also be displayed. A maintenance check list display 153 may further be provided, which, in the illustrative embodiment, displays the status of the filter or whether a "clean" cycle is being performed, or whether a summer timer or a temperature lock is on or off, or whether a spa lock is on or off. In one embodiment, a "Spa Lock" will lock out all pushbutton operations unless an "unlock" sequence is keyed. Similarly "Temperature Lock" locks out the spa Temperature Control buttons while leaving the other buttons functional and similarly is unlocked by a key sequence.

Figure 7:
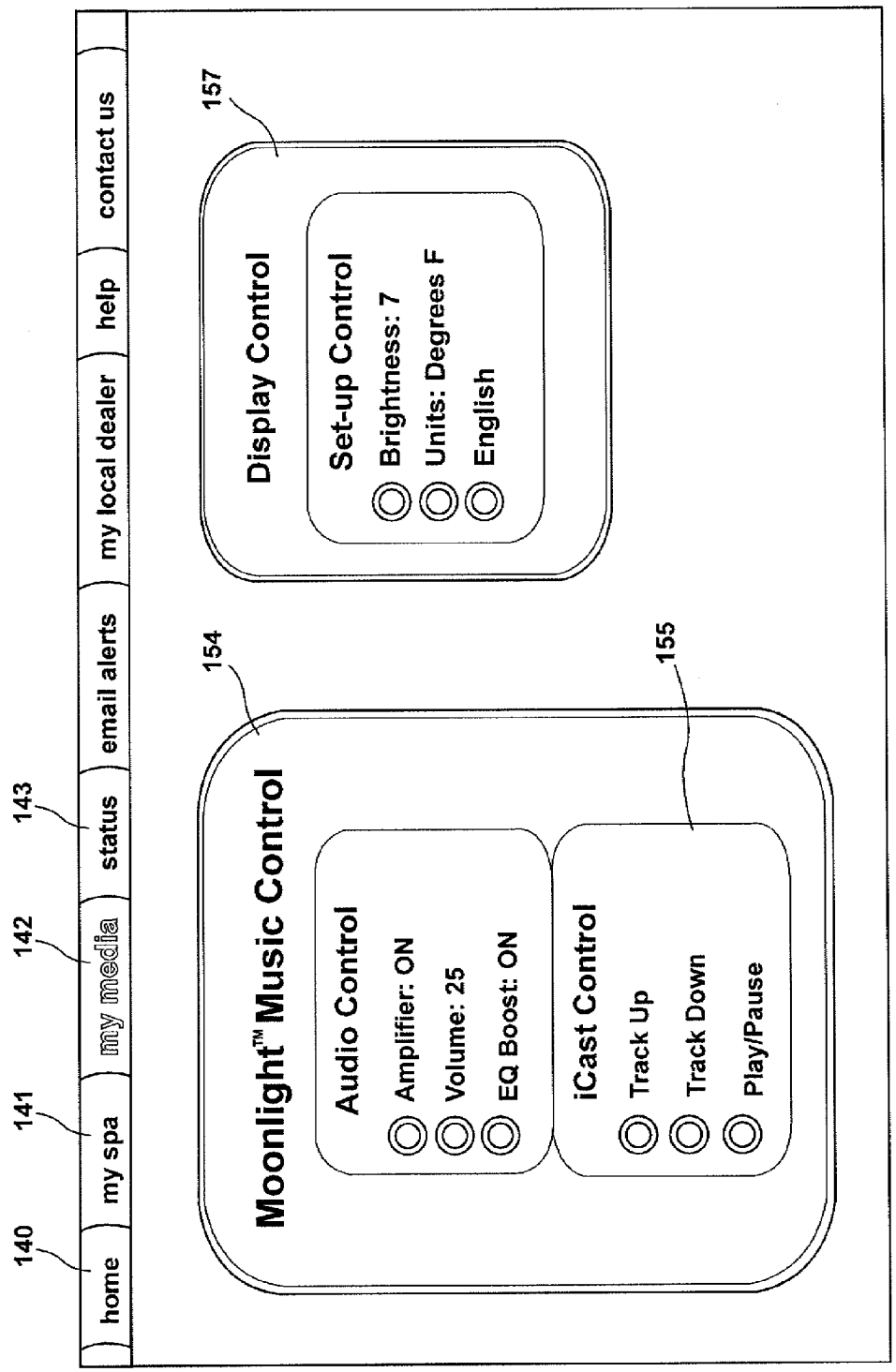

Selection of the "my media" link 142 results in provision to the user of the screen display of FIG. 7. This display provides a music control display region 154 providing audio control via an amplifier "on" or "off" button, a dropdown selection for controlling the audio volume and selection of an equalizer boost function. An iCast control display area 155 permits control of, for example, an iPod music input. FIG. 7 further provides a "display control" area 157, which allows the user to set the brightness of the user interface display, whether the temperature is displayed in Fahrenheit or Centigrade, and whether the user interface display is in English or in another selected language.

Figure 8:
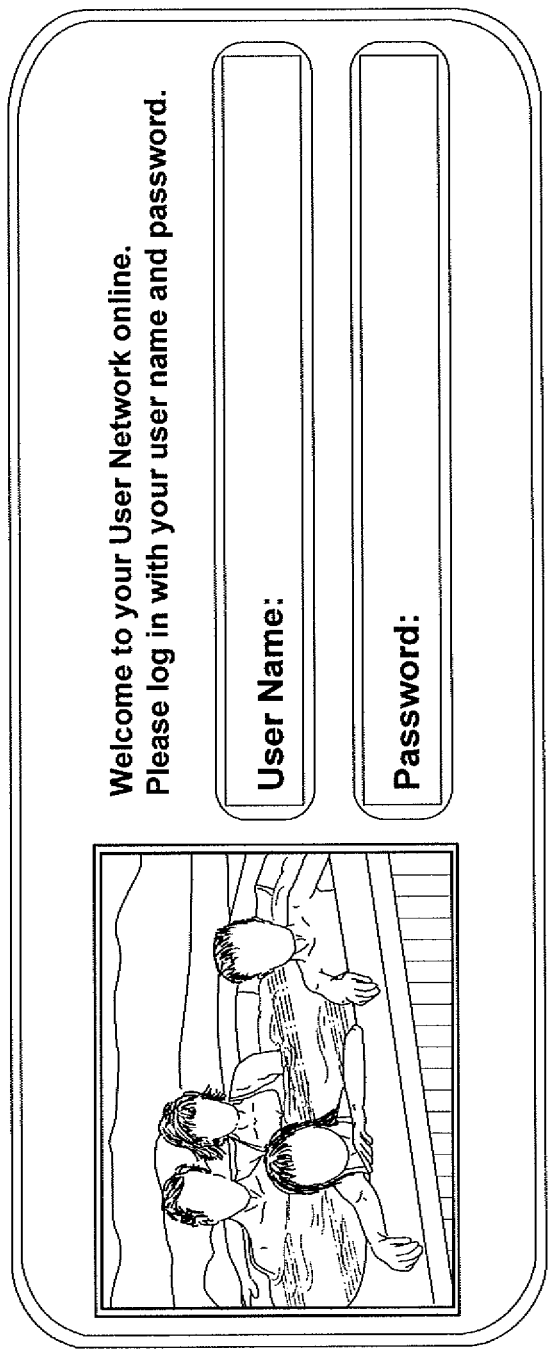
FIGS. 8-11 illustrate web pages which may be provided by a central server to a spa dealer computer according to one illustrative embodiment.

FIG. 8 illustrates a dealer log-in display wherein a spa dealer may enter a user name and password. In this particular embodiment, the dealer may select one of three display screens by clicking or otherwise performing a selection operation on the links 159, 160, 161, labeled "customer status", "spa operations" and "spa diagnostics", e.g., in FIG. 9.

Figure 9:
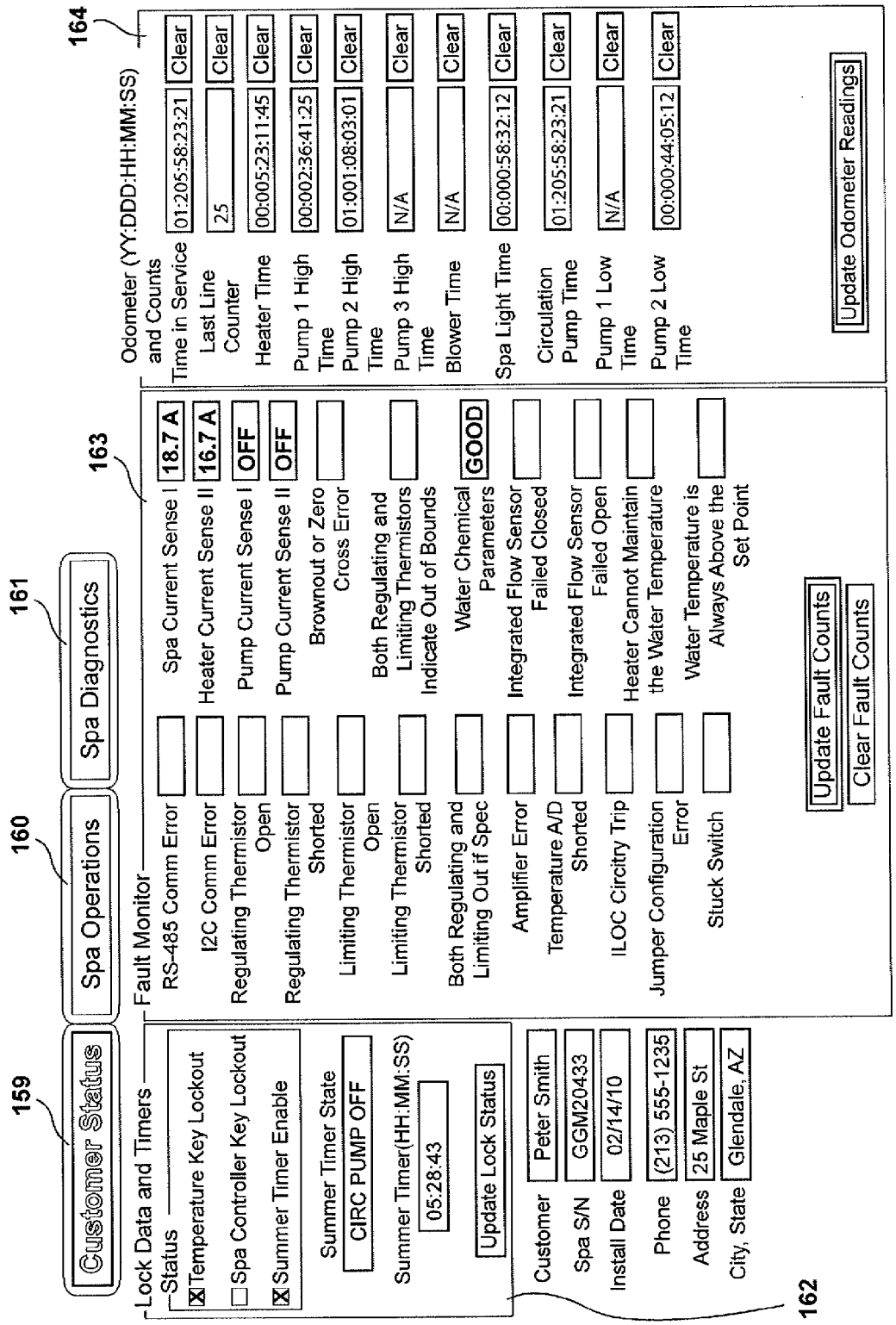

FIG. 9 particularly illustrates a customer status display screen for a particular customer, in this case "Peter Smith", and provides information such as the spa serial number and installation date of Peter Smith's spa, as well as his phone number and address. A "lock data and timers" display 162 is also provided, indicating the status of various lock-outs and other status information, including temperature key lock-out, spa controller key lock-out, summer timer status, and the summer timer time. A fault monitor display region 163 is further provided in FIG. 9 to display various errors conditions should they occur at the user's site. Display is further provided of the reading of the spa current sensor, the spa heater current sensor, the pump current sensor, and the status of the water chemical parameters. The display screen of FIG. 9 further provides an odometer count display region 164, which, for example, displays the amount the time the user's spa has been in service, the amount of time the heater has been operated, and similar times of operation for various other spa components.

Figure 10:
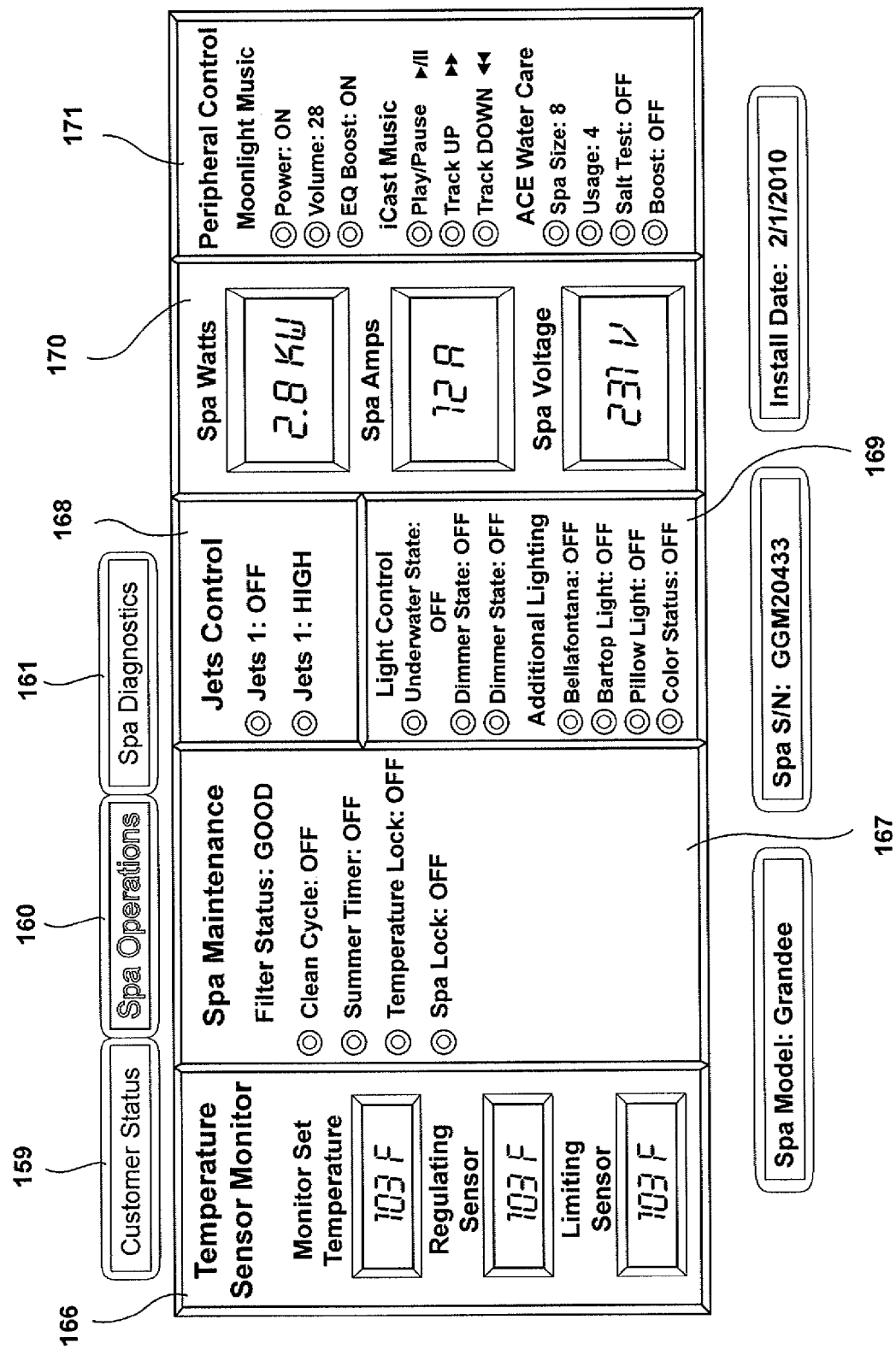

FIG. 10 illustrates a "spa operations" display screen reached by selecting the "spa operations" link 160. The screen of FIG. 10 includes a temperature sensor monitor area 166, which displays the temperature at which the spa is set to operate, as well as the water temperature sensed by the spa's regulating and limiting temperature sensors. A spa maintenance display area 167 is further provided displaying a filter status, clean cycle status, summer timer status, temperature lock status, and spa lock status. A jets control display area 168 is further provided, which permits the dealer to control the operation of the spa jets including whether they are on or off, or, for example, operating at a high or a low speed. A light control display area 169 is located beneath the jets control which allows the dealer to control the on/off status of various lights in the spa lighting system. An electrical parameter display area 170 displays the watts of power being consumed by the spa, as well as the spa's amperage and operating voltage. Finally, a peripheral control display area 171 is provided to facilitate control of the spa music system and water care system.

Figure 11:
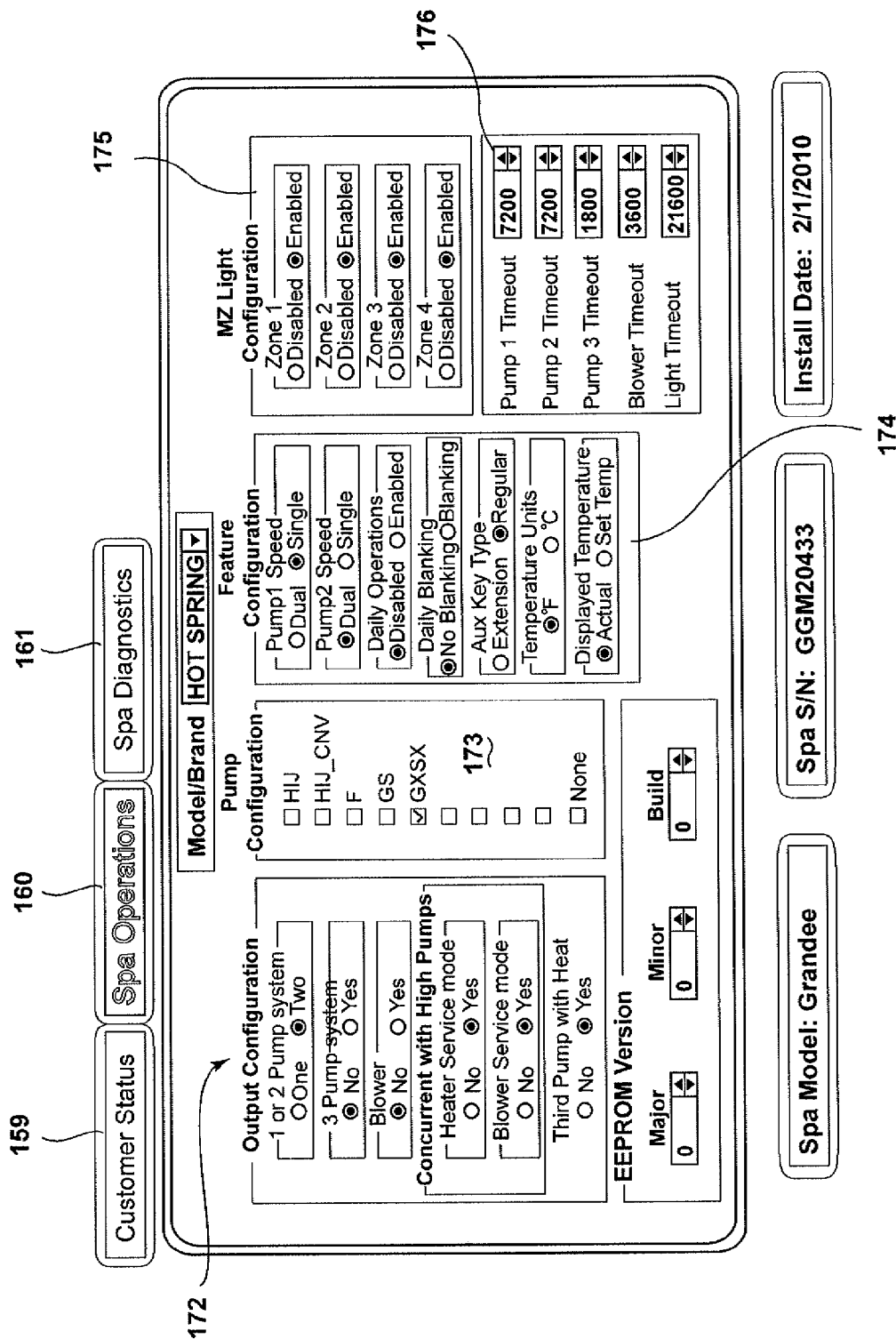

FIG. 11 discloses a spa diagnostics display screen reached by selecting the spa diagnostics link 161. The display of FIG. 11 includes an output configuration display area 172 showing, for example, whether the particular user's spa has one, two, or three jet pumps, whether it has a blower, and the heater and blower service modes. A pump configuration display area 173 may be provided to indicate which one of several configurations the user's pumps are in. A feature configuration display area 174 is further provided to indicate whether pump speeds are dual or single, whether daily operations are enabled or disabled, whether the display temperature is in Fahrenheit or Centigrade, and whether the display temperature is the actual water temperature or the set water temperature. Finally, a lighting display configuration area 175 is provided indicating the status of various lighting zones, and a timeout display area 176 is provided indicating timeouts for the pumps blowers and lights. Pump timeouts are the time values that control when a manually operated jet pump turns itself off automatically if the user does not otherwise operate the jets.

Figure 12:
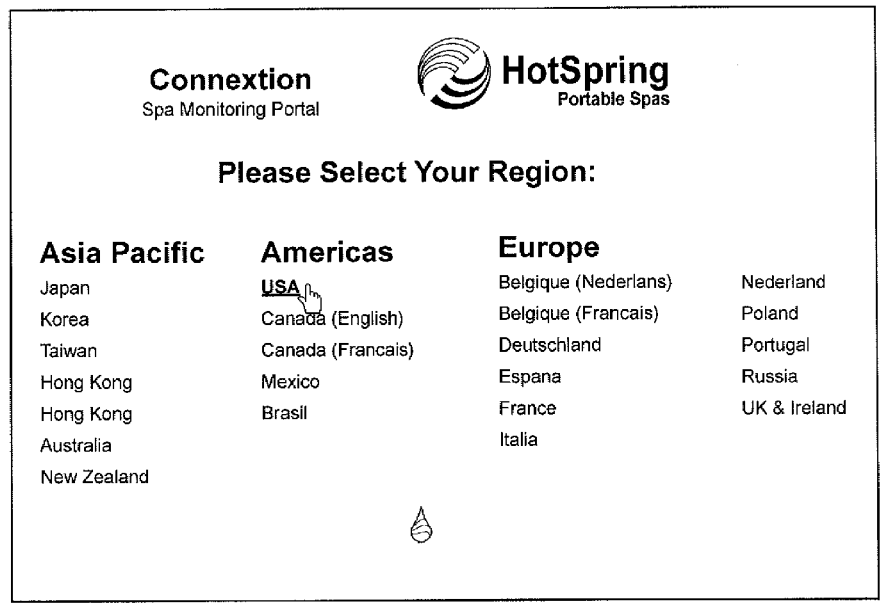
FIGS. 12-21 illustrate an alternative embodiment of webpages which may be provided by a central server to a spa user/owner's computer.

FIGS. 12 through 25 illustrate an alternate website configuration providing a set of web pages shown in FIGS. 12-21 provideable by the server 111 to the spa users/customers and a set of web pages shown in FIGS. 22-25 provideable by the server 111 to a spa dealer. In particular, FIG. 12 illustrates an entry display screen which may be reached from a spa manufacturer's homepage, for example, such as www.hotspring.com or www.caldera.com, by clicking on a button, for example, labeled "my spa" or the like, on the manufacturer homepage. The display of FIG. 12 enables a user to set up and select a particular region and/or language, which will be employed in subsequent operations. In one embodiment, once a selection has been made on the display of FIG. 12, the next time the "my spa" or similar link is selected on the manufacturer homepage, a stored cookie will cause the user to be linked directly to the display of FIG. 13, which is the log-in screen. Either a spa user/homeowner or a dealer can log in using the display screen of FIG. 13. A dealer access level causes the dealer to be supplied initially upon log-in with the display screen of FIG. 22.

Figure 14:
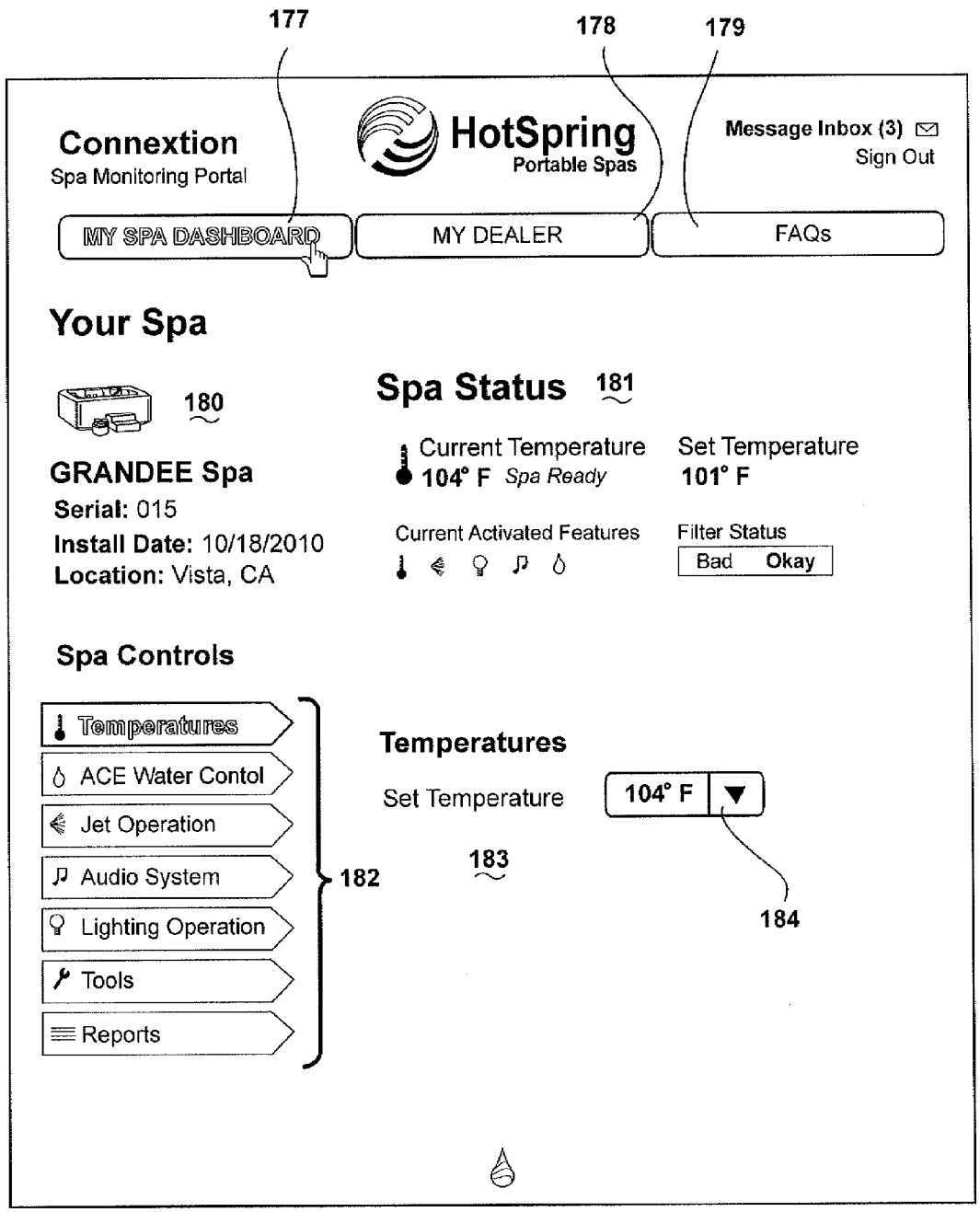

A homeowner/end user log-in causes the user to be supplied by the server with the display screen of FIG. 14 with the link "my spa dashboard" highlighted or emphasized. As may be seen from FIG. 14, the user may navigate from the spa dashboard page to two other pages, a "my dealer page" and a frequently asked questions "FAQS" page. The display screen of FIG. 14 includes a "your spa" area 180 with the specifications of the user's spa, and a spa status region 181. The spa status region 181 displays the current water temperature and set water temperature of the user's spa, and the filter status, as well as indicators specifying which spa features are currently activated. When one of a column of seven "Spa Controls" links 182 is selected, the display 183 adjacent the respective arrow tips of the links changes, depending upon which one of the seven links 182 is selected via a point and click, touch sensitive, or other similar operation. The display screen of FIG. 14 shows the display presented in area 183 when the "Temperature" link is selected. In such case, the set water temperature is displayed to the user along with a dropdown arrow 184, which causes display of a column of other temperatures which the user may select in order to change the set temperature.

Figure 15:
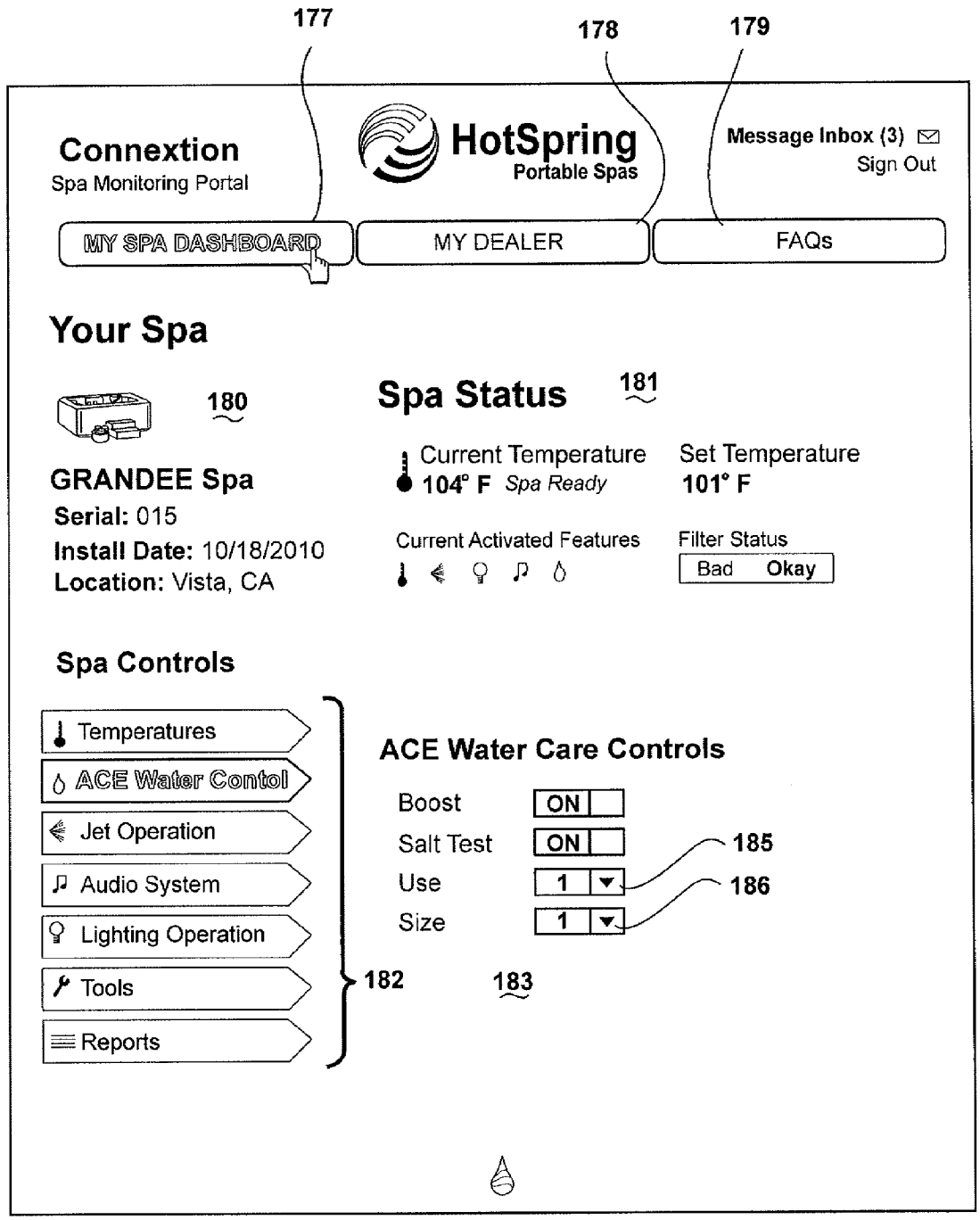

The display of FIG. 15 illustrates the state of the spa dashboard screen when the "Ace Water Control" link is selected. In this case, the display region 183 shows the status of a "boost" command, a salt test and the spa use and spa size level selections. Spa usage level and spa size may be selected or specified by the user utilizing respective dropdown arrows 185, 186. In one embodiment, spa size and usage levels are inputs provided to a spa sanitizing system in order to control the amount of purifying agents, for example, oxidizers, such as chlorine, generated by the spa sanitizing system. In one embodiment, the user may further activate the "boost" command or the salt test command. Activating the salt test command causes the spa sanitizing system to perform functions which measure the salt level and indicate whether it may be necessary to add salt, for example. Activating the "boost"

command causes generation of additional spa purifying agents such as chlorine, to be added to the water. In one embodiment, the "boost" command may cause an oxidizer generating device to run for an extended period of time, such as, for example, 24 hours.

Figure 16:
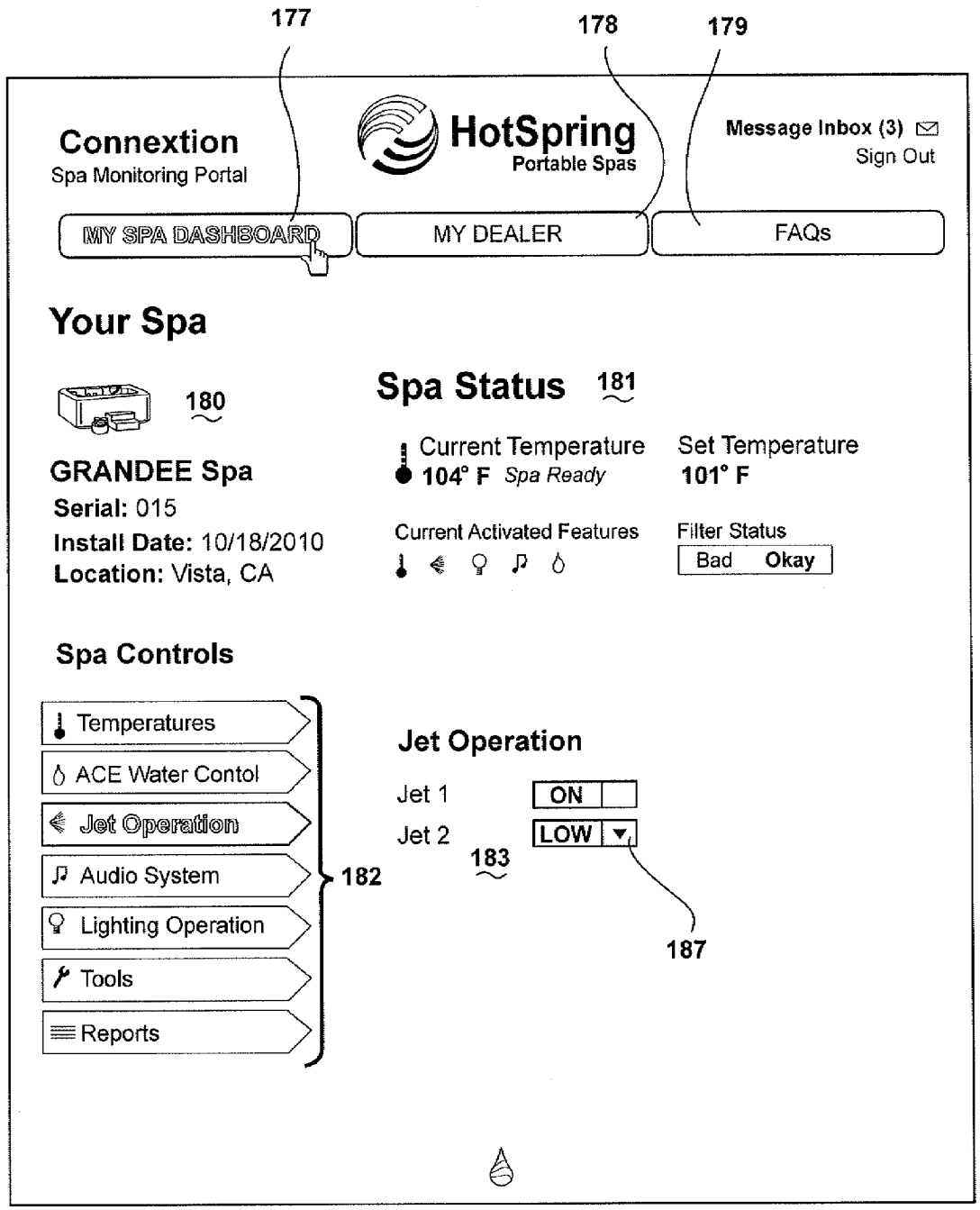

FIG. 16 indicates the display provided by the spa dashboard page when the third link "Jet Operation" of the links 182 is selected. In such case, the status of the jets is indicated in area 183, for example, Jet 1 "on" and Jet 2 "low", where Jet 2 is a selectable speed jet. With respect to Jet 1, for example, the user may turn that jet on or off, for example, by a point and click operation, or may select the speed of operation of the variable speed Jet 2 employing, for example, a point and click selection performed on a dropdown menu 187.

Figure 17:
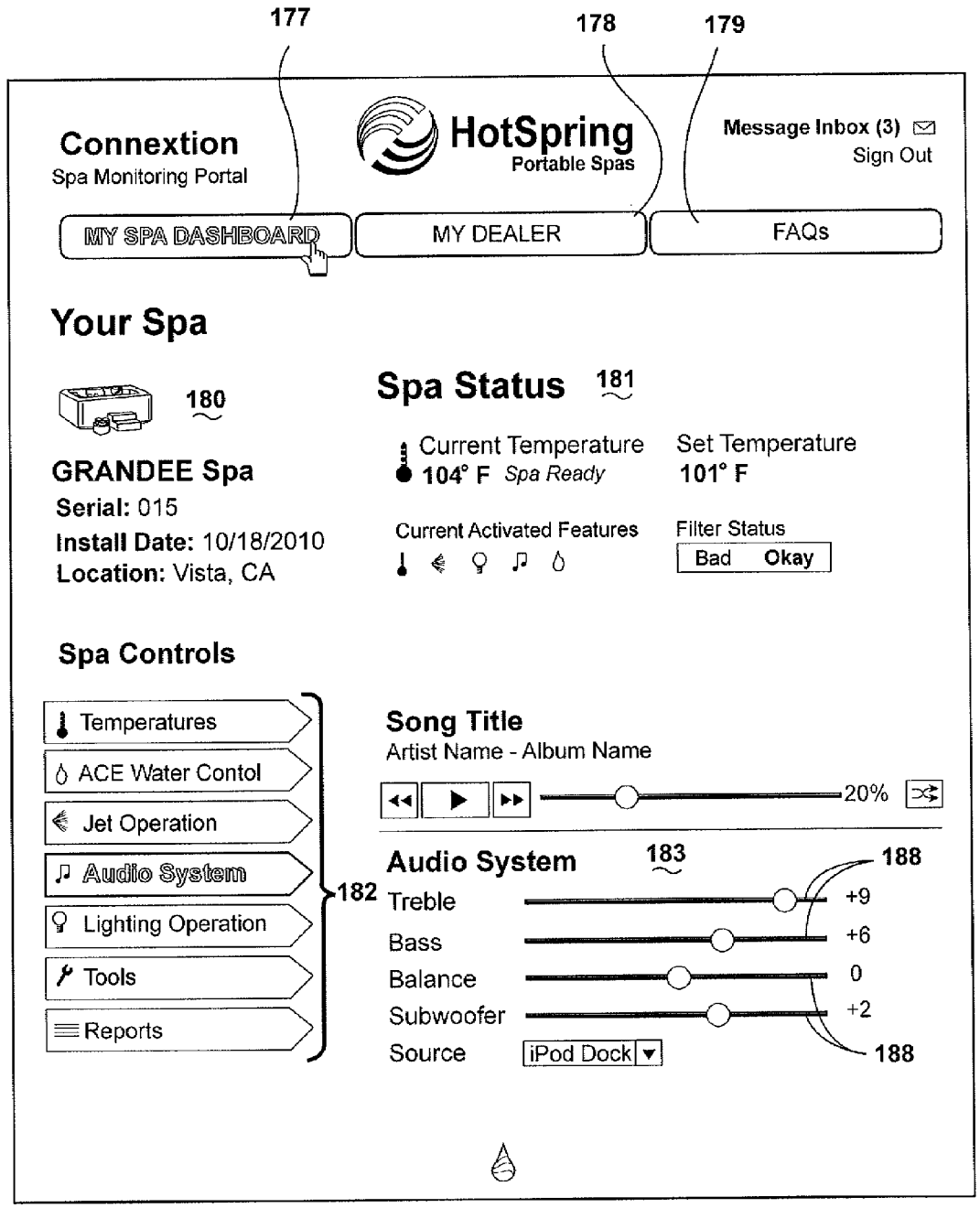

FIG. 17 indicates the display provided by the spa dashboard page when the fourth spa control link "Audio System" of the links 182 is selected. The display area 183 in the embodiment shown may provide the song title, artist name, and album of a song being played by the audio system and also provides sliders 183 for adjusting treble, base, balance, and subwoofer. The sliders 183 may be moved either left or right by, for example, touching them with a mouse cursor and moving the slider to the left or right with the mouse. Alternately, of course, in a touch screen embodiment, the user's finger could be used to move a slider 181 to the left or right.

Figure 18:
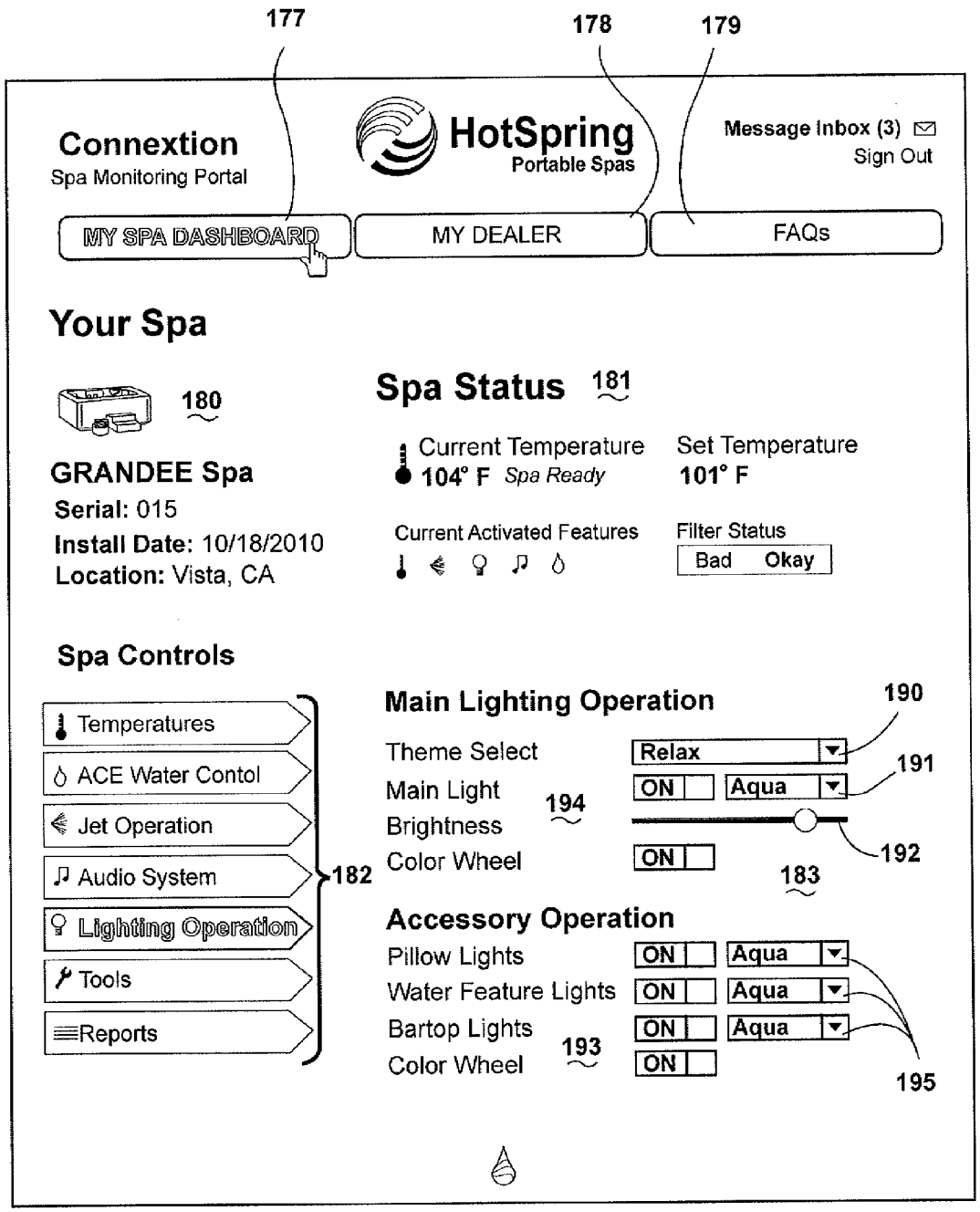

FIG. 18 illustrates the display provided by the spa dashboard page when the fifth link "Lighting Operation" of the links 182 is selected. A "Main Lighting Operation" display area 194 is provided to the user in such case and includes a "Theme Select" dropdown menu 190 which, for example, may enable the user to select various lighting effects such as "relax," "tranquil", "ocean breeze", "sunset", or "candlelight". A main spa light may be turned "on" or "off" by the user, for example, by a point and click operation, and the color of the main light may be selected employing a dropdown menu 191, for example. A brightness slider 192 is further provided to allow dimming or brightening of the light level provided by the main light. An "Accessory Operation" display area 193 enables various light features to be turned "on" or "off" by the user, and their colors varied by employing a dropdown menu 195. The particular display lighting features in area 193 include pillow lights, water feature lights, bar top lights, and a color wheel.

Figure 19:
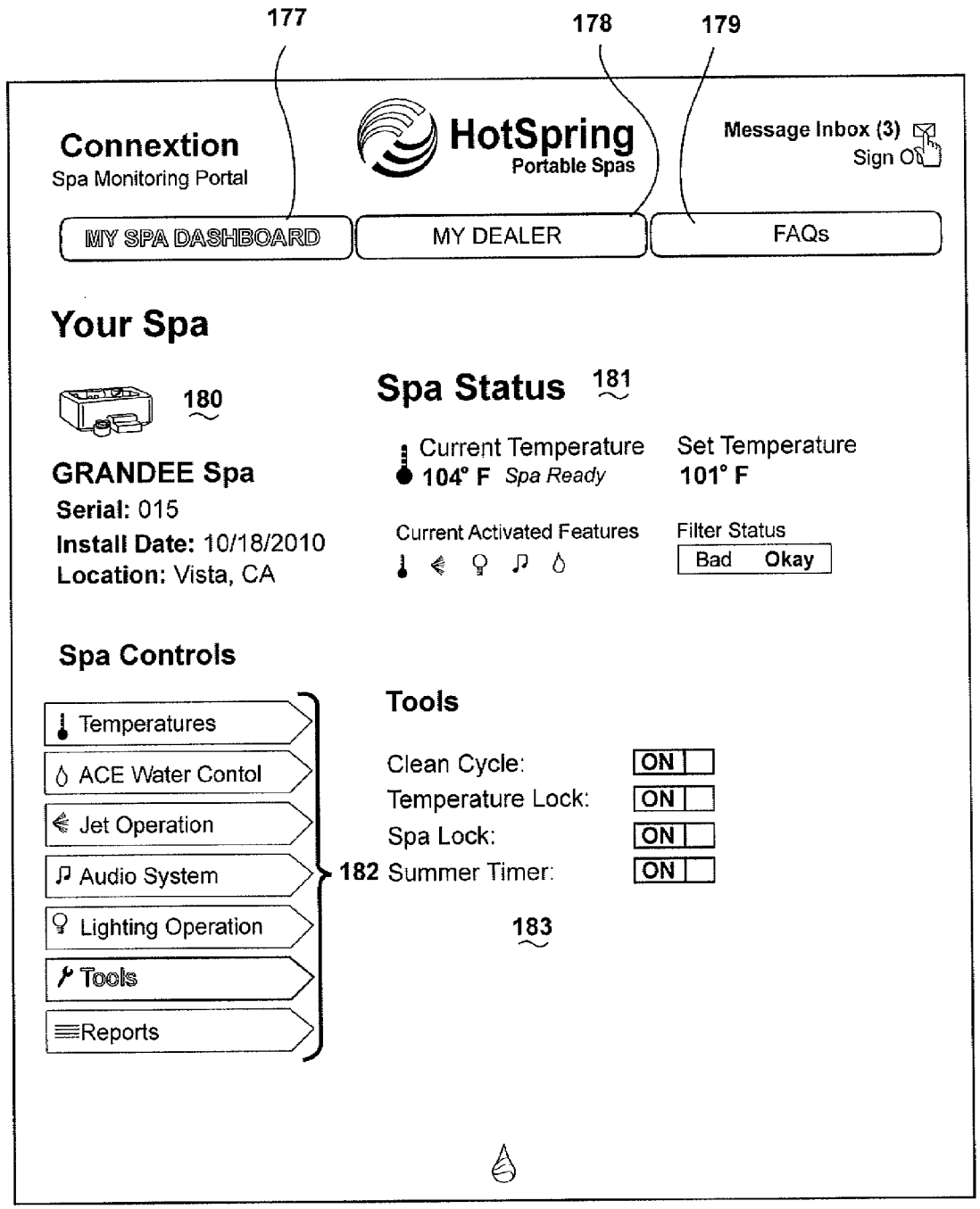

FIG. 19 illustrates the display provided by the spa dashboard page in area 183 when the user selects the "Tools" link of the link list 182. In the particular embodiment shown, the tools displayed in area 183 include "clean cycle", "temperature lock", "spa lock", and summer timer settings, which may be either set "on" or "off" by the user.

Figure 20:
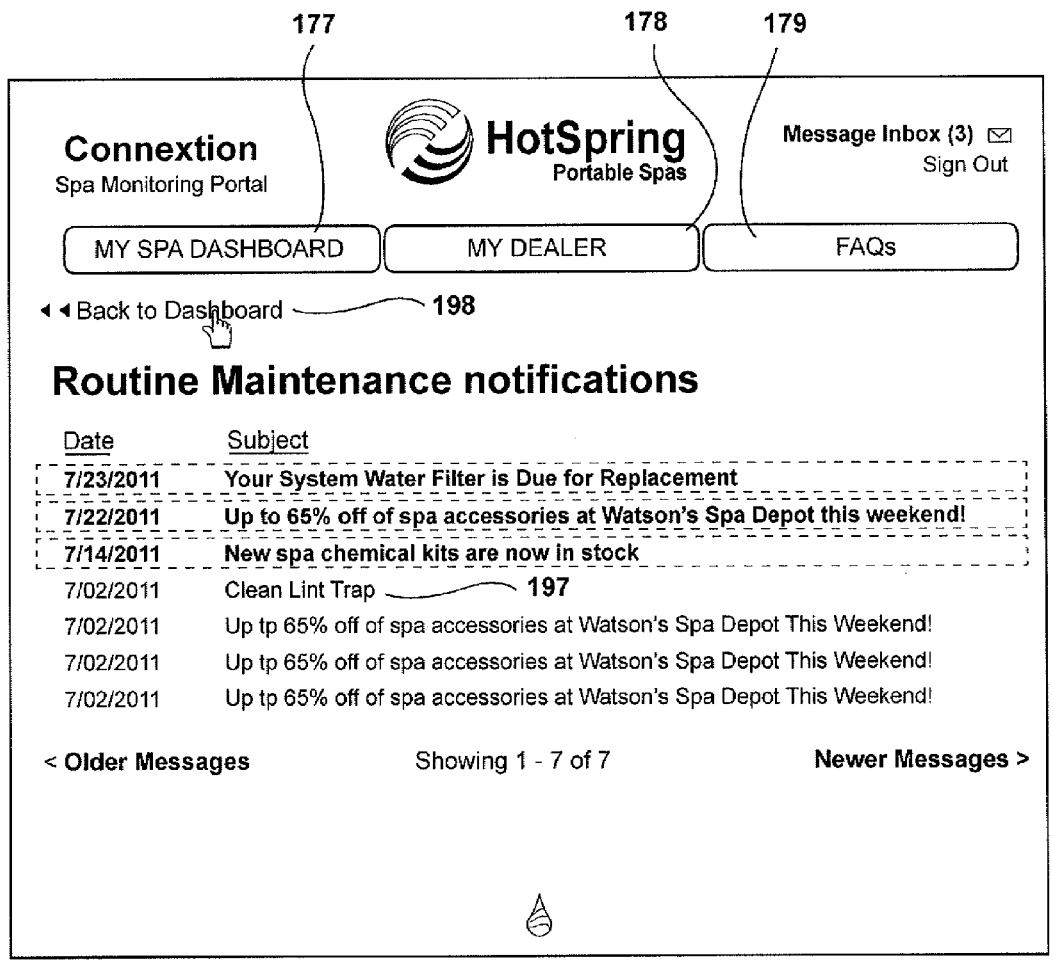

FIG. 20 illustrates a Routine Maintenance Notifications webpage. FIG. 20 is displayed when the user selects the "Reports" link of the link list 182 of the spa dashboard. The Routine Maintenance Notifications page provides maintenance notifications to the user such as, for example, that the system water filter is due for replacement. In one embodiment, for example, the spa node 23 may send a "dirty filter" message to the server 111, which then sends a "clean lint trap" message maintenance notification 197 to the end user. The server 111 is capable of combining or performing mathematical operations with various inputs received from the spa node 23 to make a decision as to what type of notifications should be sent to the user like "clean your filter". In one embodiment, the Routine Maintenance Notification page may be constructed to display energy consumption information or spa usage charts. The user may return to the spa dashboard page by clicking on the "back to dashboard" link 198.

Figure 21:
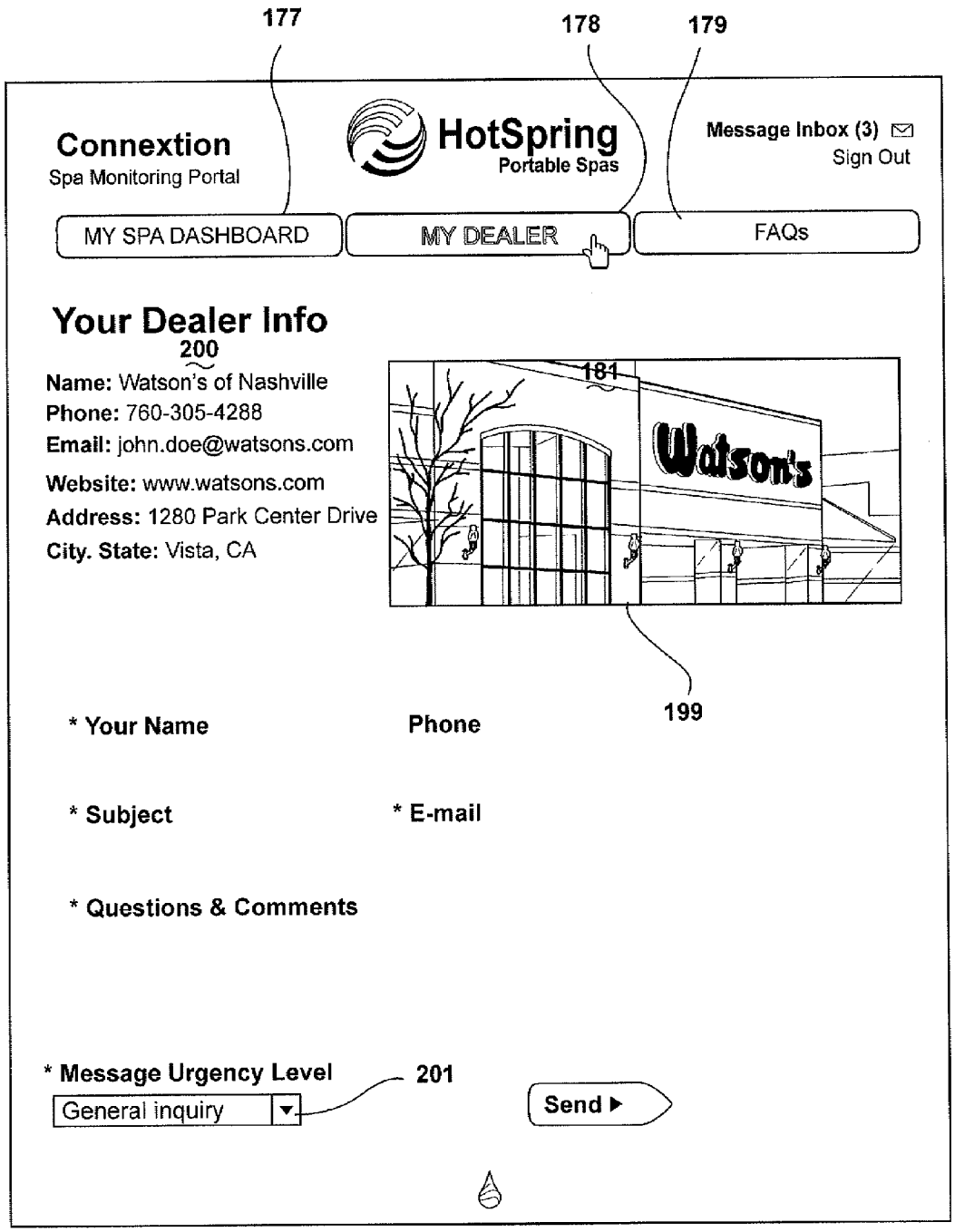

In one embodiment, selecting the "My Dealer" link 178 on the spa dashboard page provides the user with the webpage shown on FIG. 21, which, in this embodiment, displays an image 199 of the spa dealer retail outlet where the user purchased the spa. In one embodiment, the dealer can change the displayed image 199 and can also optionally provide display advertisements to the user/customer on this page. A dropdown menu 201 is also provided allowing the spa owner to send a message to the dealer. In one embodiment, when the "general inquiry" message urgency level is selected, an email message addressed to the dealer comes up on the user's display, and the user may then enter his questions or other information to be transmitted to the dealer computer 113.

Figure 13:
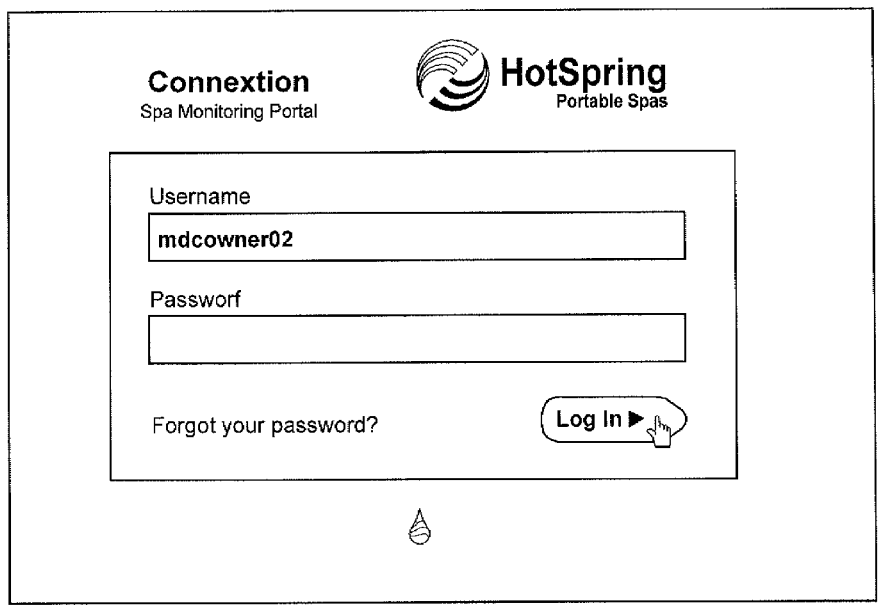
Figure 22:
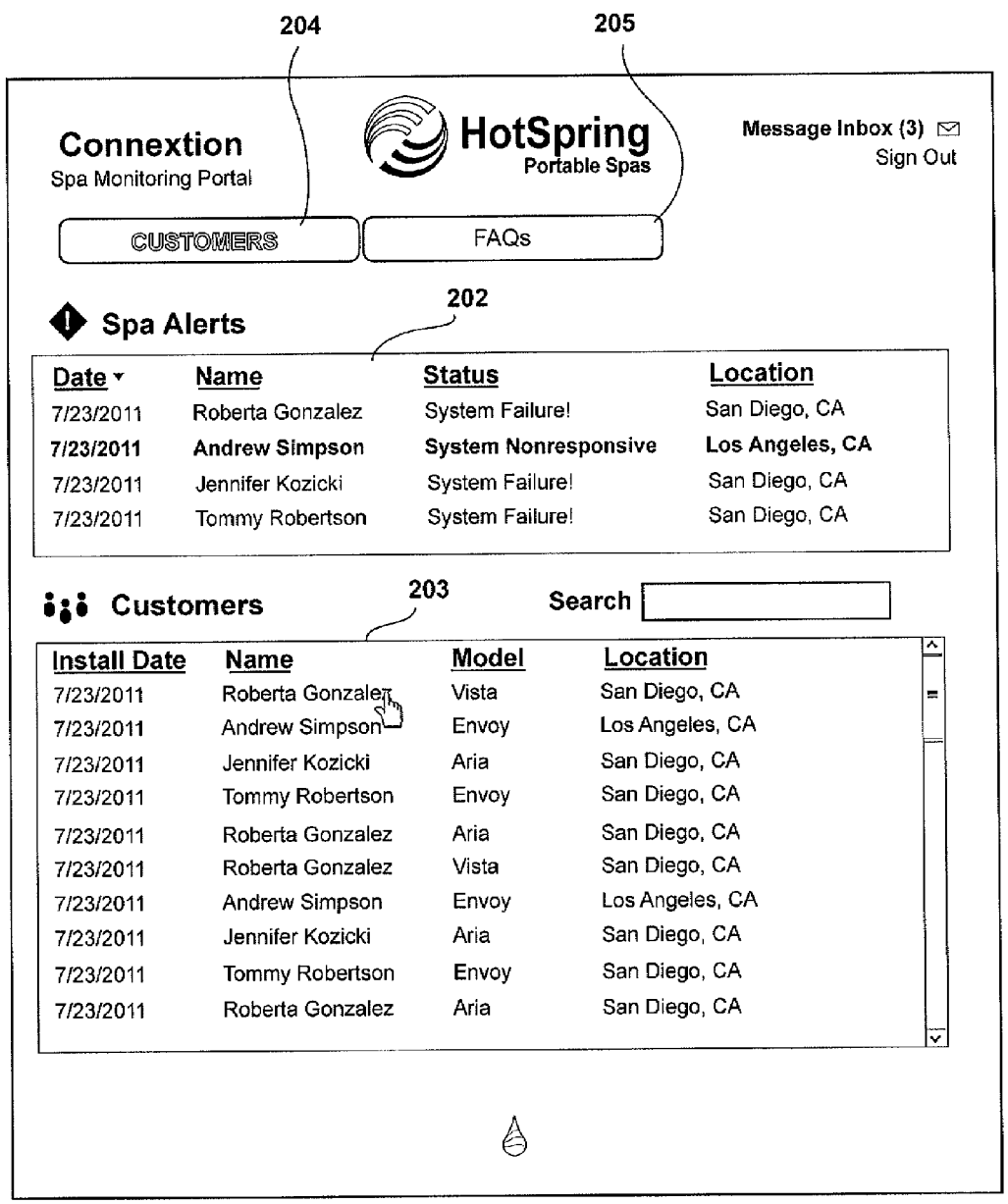
FIGS. 22-25 illustrate an alternate set of web pages which may be provided by a central server to a spa dealer computer.

FIG. 22 illustrates the first display screen provided to a spa dealer on the display device associated with a dealer computer, e.g., 113, when the dealer enters the spa monitoring portal via the login display of FIG. 13. The webpage of FIG. 22 includes an alert box 202 listing customers and status information regarding troubles or system failures experienced by their respective spas, as well as the location of the customer and the date that the alert was generated. The display of FIG. 22 further provides a scrollable list of customers 203 which is searchable in one embodiment by spa model customer name, city, and technician assigned to that customer. In one embodiment, the "spa alerts" displayed in box 202 are sent by a spa node 23 directly to the dealer without involvement of the central server 111.

Figure 23:
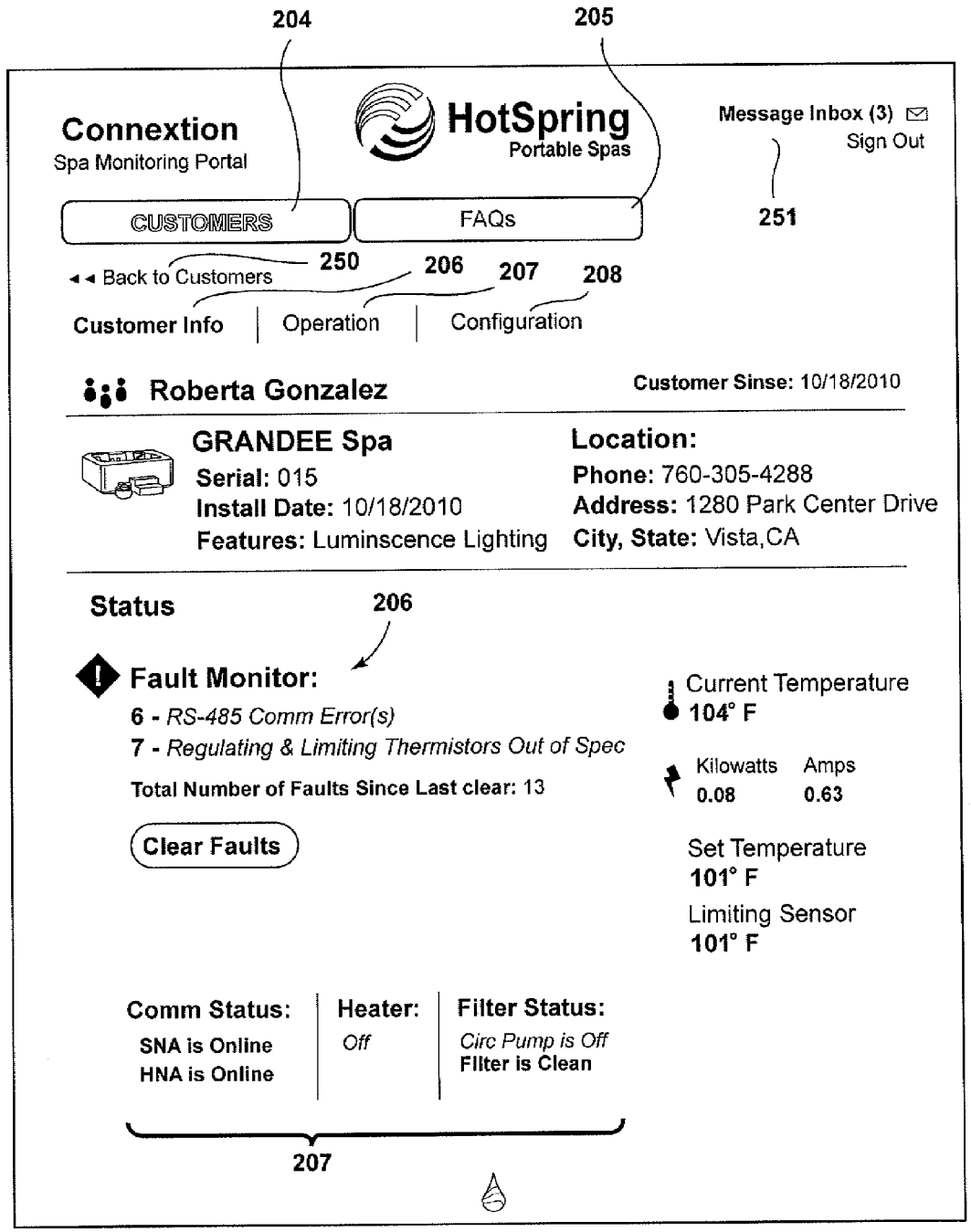

FIG. 23 illustrates a webpage or screen display provided to the dealer computer 113 when the dealer selects a particular customer's name on the screen of FIG. 22. The screen of FIG. 23 provides information about the customer's spa, customer contact information, and further provides status information 206. The status information 206 particularly includes fault monitor status, which reports various fault conditions in the customer's spa. In one embodiment, the dealer is enabled to clear such faults. A system status display 207 is also provided including the current water temperature, the current kilowatts and amps, the set temperature of the spa, and the water temperature reading of a limiting temperature sensor of the spa, all of which have been transmitted from the spa node 23 to the server 111, and then provided to the dealer, for example, via the dealer computer 113 and associated display. The display further provides a communication status display indicating at a glance that the SNA 23 and HNA 25 are both online and the status of the spa heater and spa filter.

The webpage of FIG. 23 additionally provides three links 206, 207, 208, to three respective webpages: a customer information page, an operation page, and a configuration page. A "back to customer" link 250 is also provided to enable returning to the display screen of FIG. 22. A message inbox display 251 is also provided to inform the dealer of alerts which have been received but not acknowledged. In one embodiment, clicking on this link 251 returns the dealer display to the customer display of FIG. 22.

Figure 24:
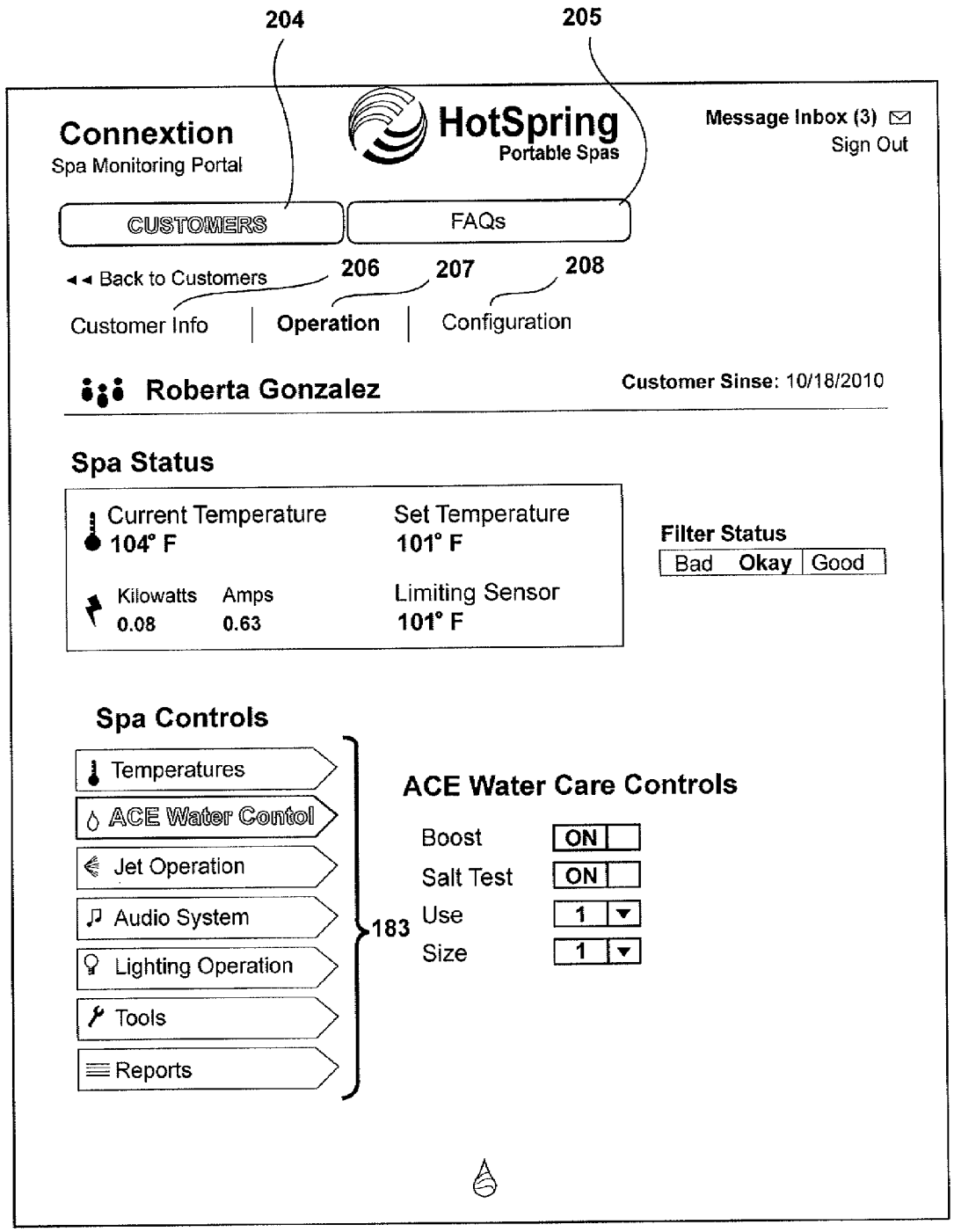

FIG. 24 illustrates the display provided to the dealer when the operation link 207 of FIG. 23 is selected. The display screen of FIG. 24 provides electrical and diagnostic information as to the spa status as well as to the filter status. It further provides the dealer with the same set of spa control links 183 provided on the homeowner/end user's pages of FIGS. 14-20 and enables the dealer to control the functions of the spa in the same fashion by commands transmitted from the dealer node 113 to the spa node 23.

Figure 25:
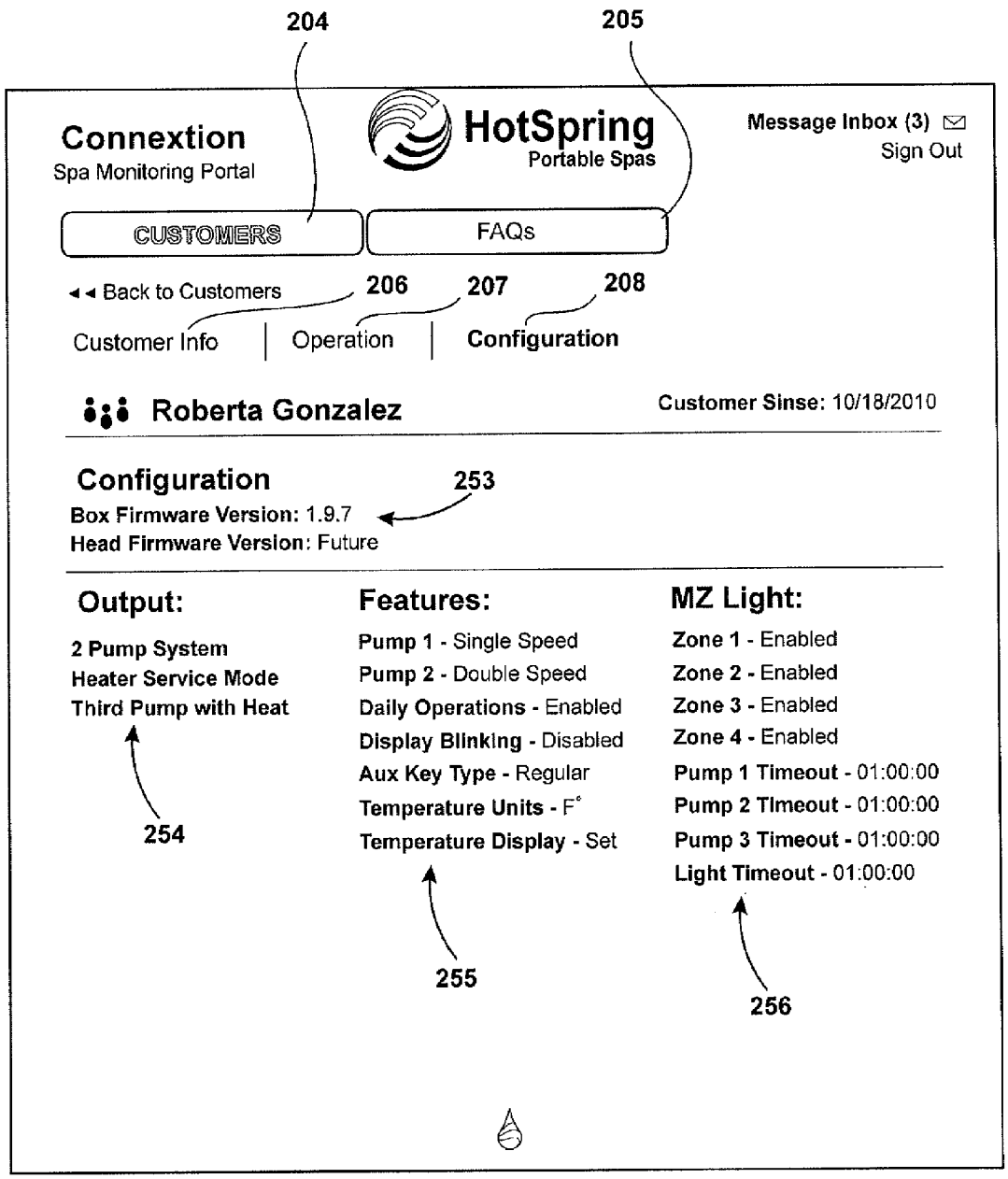

FIG. 25 illustrates the display screen provided to the dealer when the dealer selects the configuration link 208. The screen of FIG. 25 provides the dealer with information as to the firmware version being used by the spa controller 13 at the particular customer's site, as well as spa output information 254, spa feature configuration information 255, and spa lighting configuration information 256. In one embodiment, the output features and lighting parameters are read-only, but in another embodiment, they may be read/write, allowing the dealer to change various configuration parameters, for example, changing the zone lighting configuration by disabling selected zones.

Figure 26:
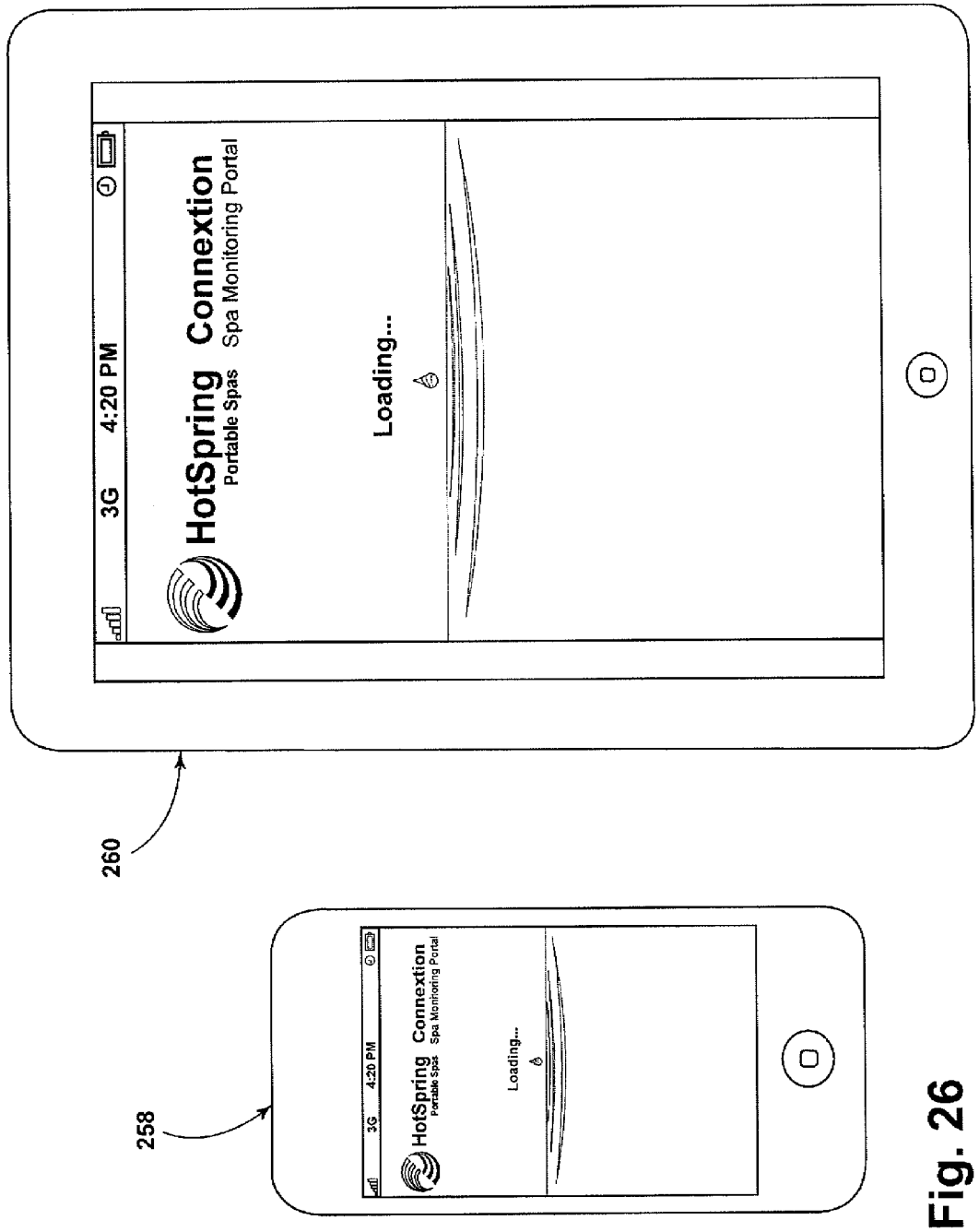
FIGS. 26-32 illustrate one embodiment of a handheld device application for communicating in the spa networking system.
Figure 27:
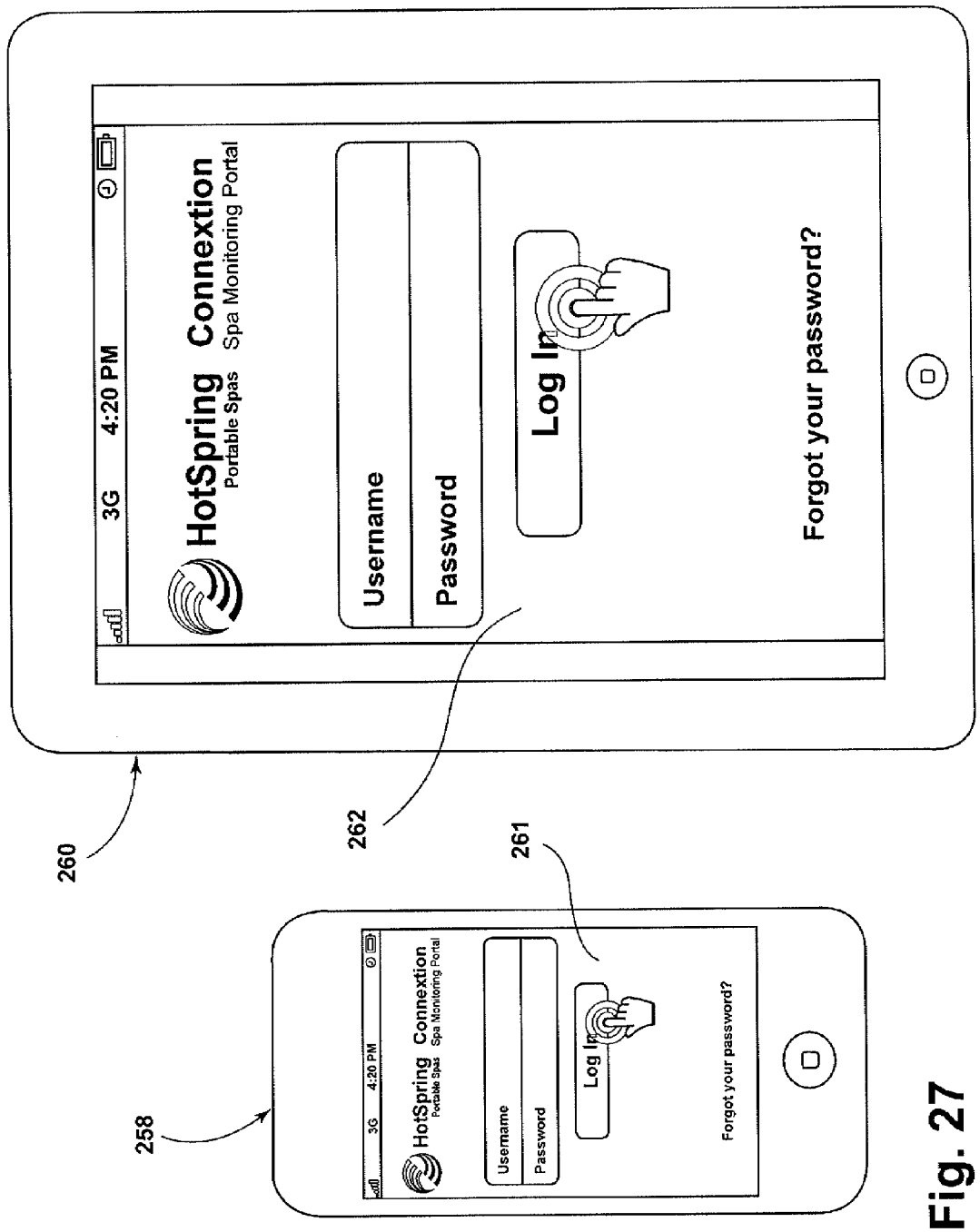

FIGS. 26-32 illustrate one embodiment of a handheld device application for communicating in the spa networking system. These FIGS. 26-32 illustrate a Smartphone application 258 on the left and a tablet application 260 on the right. FIG. 26 illustrates the application loading on the display screen on the handheld device 258, 260. The Smartphone device 258 may employ, for example, an Apple or Android operating system. FIG. 27 illustrates the user login screen which leads the user to the display screen of FIG. 28. The screen of FIG. 28 permits the user to access subsequent web pages by providing four respective links; "spa controls" link 263, "notifications and reports" link 264, "dealer info" link 265, and "settings" link 266. In one embodiment, these links 263, 264, 265, 266, are touch selectable according to conventional or other handheld device operation protocols.

Figure 28:
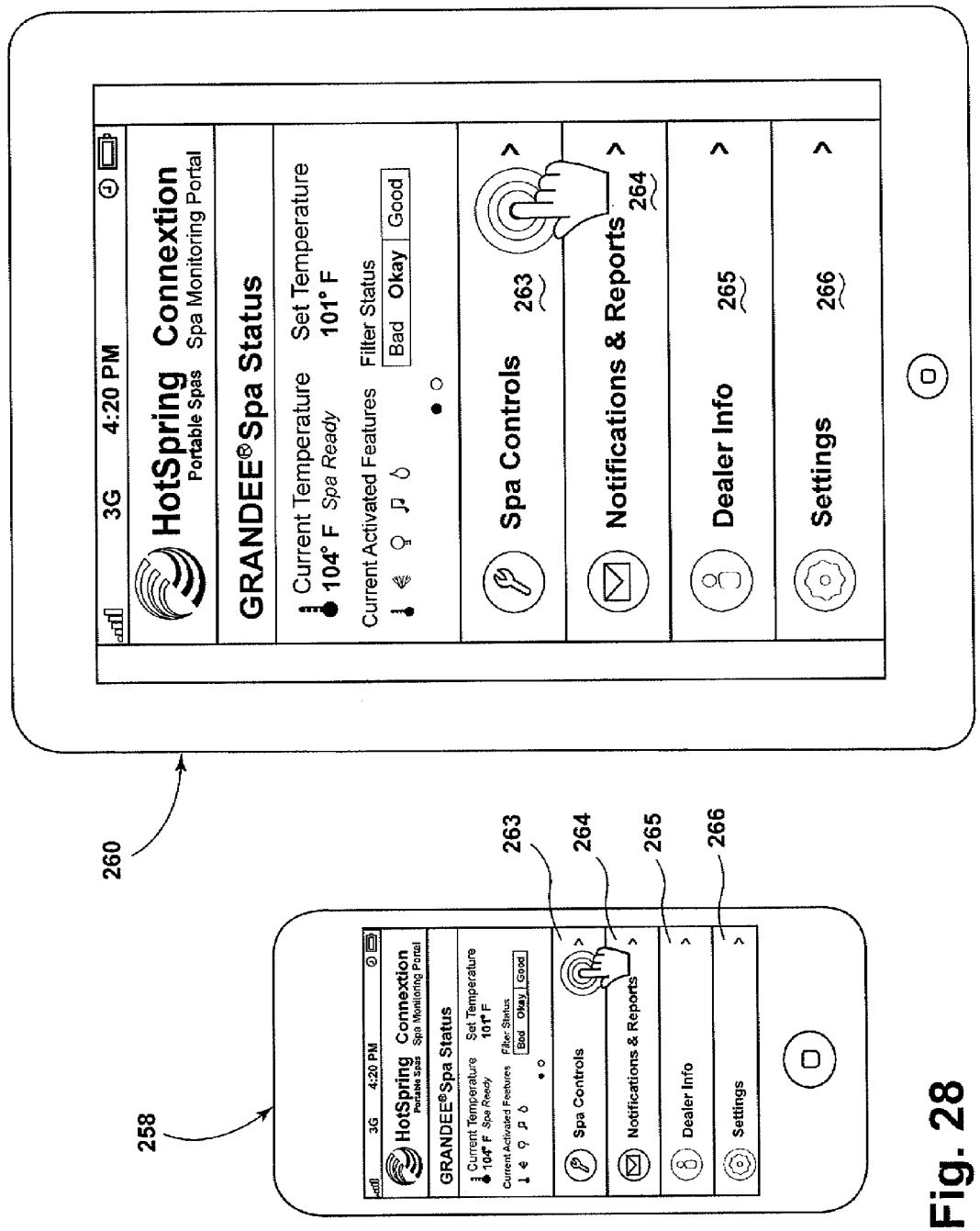
Figure 29:
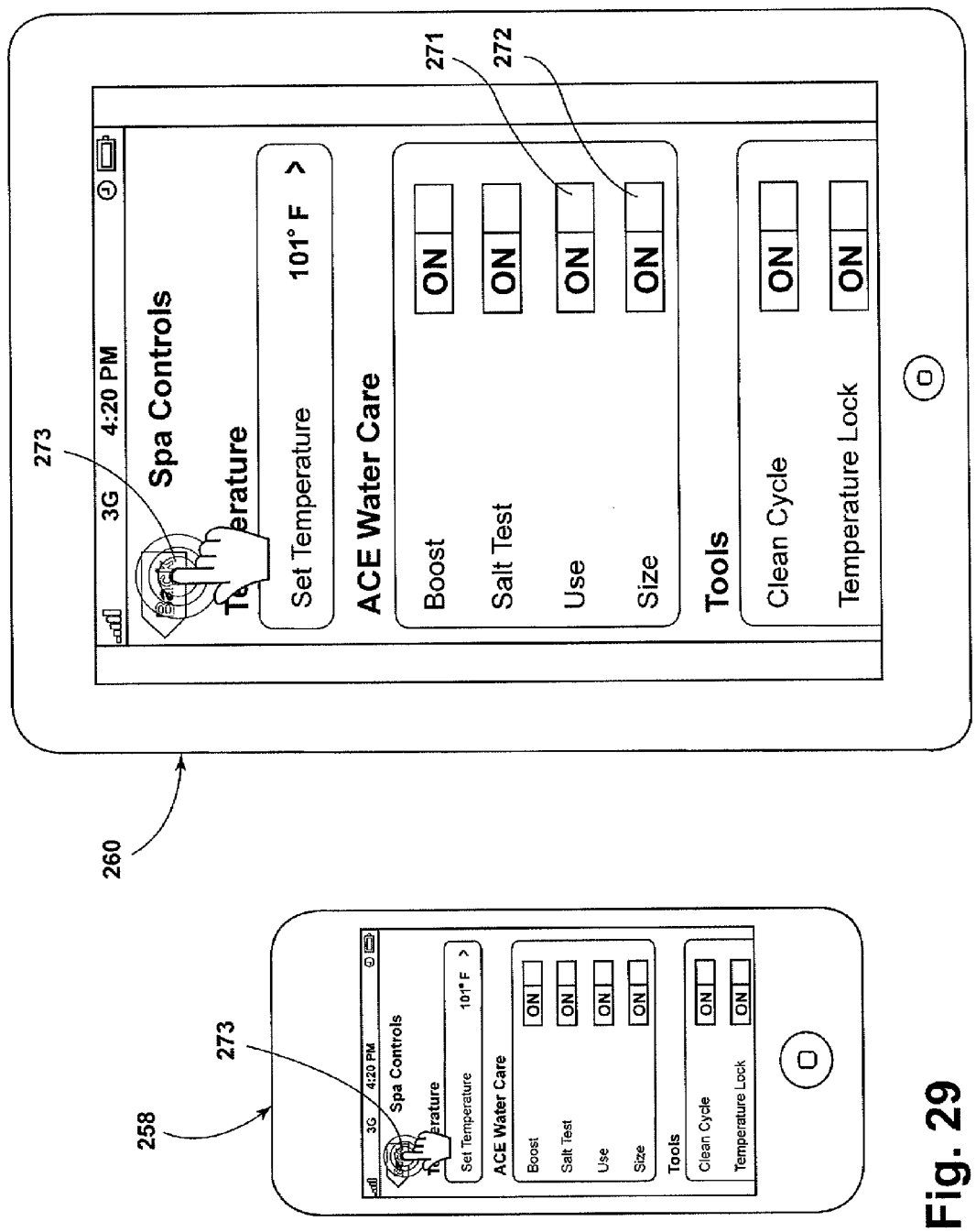

Selecting the spa controls link 263 on the display of FIG. 28 provides the user with the display of FIG. 29, which allows the user to control a number of spa parameters from the handheld device 258, 260. For example, the user can set the water temperature and can set various water care features such as turning on the boost command, initiating a salt level test, and setting the spa usage and spa size parameters via respective dropdown menus 271, 272. The screen of FIG. 29 further allows the user to select a "clean" cycle, or to turn-on or off the temperature lock.

Figure 30:
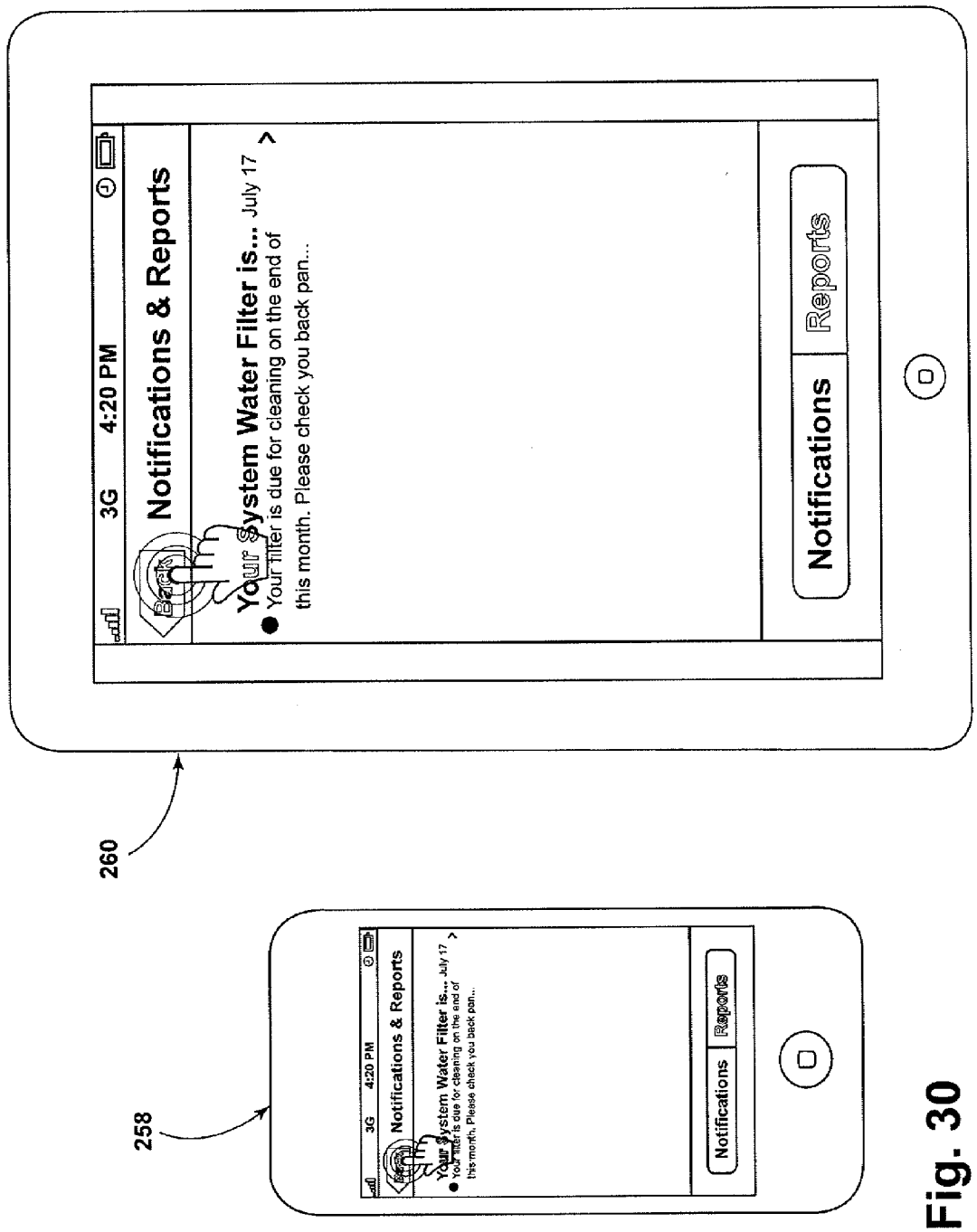

FIG. 30 illustrates the display provided to the user of the handheld device 258, 260, when the notifications and reports link 264 is selected. The notification and reports screen of FIG. 30 alerts the user to problems or to maintenance which is due or necessary with respect to the user's spa.

Figure 31:
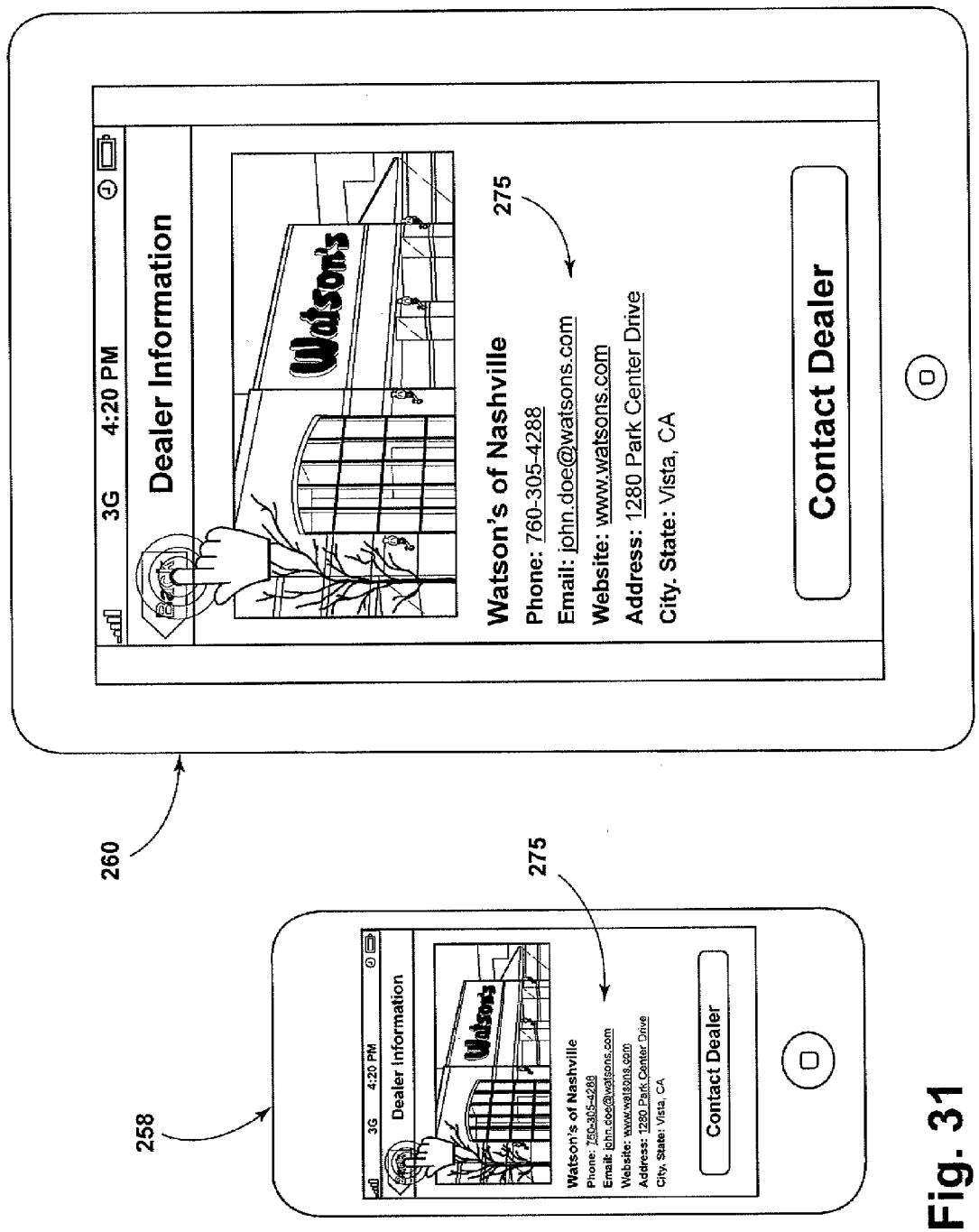

FIG. 31 illustrates the display provided to the user when the user selects the dealer info link on the screen of FIG. 28. The screen provides the handheld device's user with the dealer's contact information and enables the user to contact the dealer by either telephoning the dealer or emailing him from the handheld device. Additionally, the user can access the dealer's website using the web address provided on the display of FIG. 31.

Figure 32:
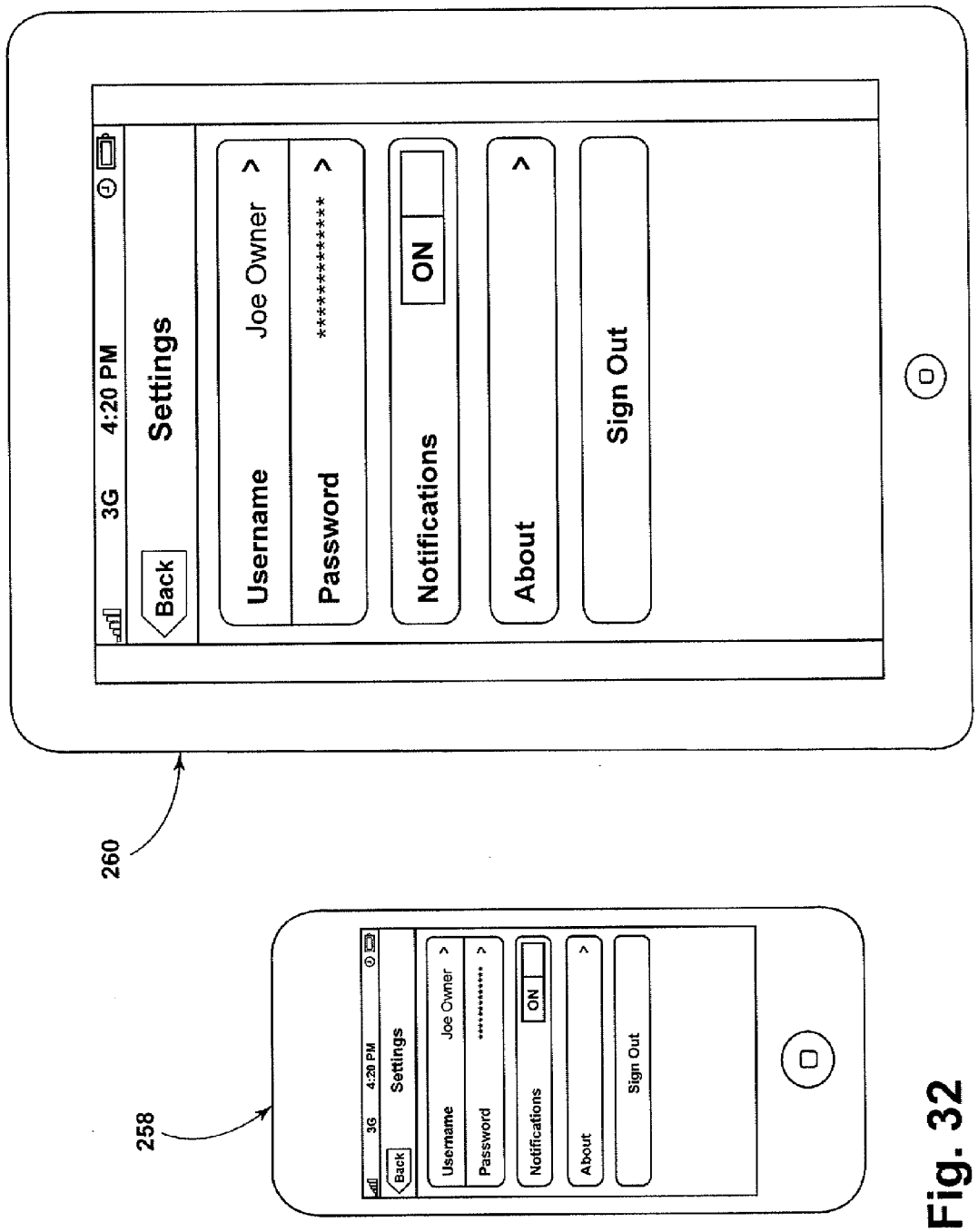

The FIG. 32 illustrates a display provided to the user when the user selects the "settings" link 266 on the display of FIG. 28. The "settings" screen allows the user to change the user name or password, disable the "notifications" function so that the user does not receive notifications, and allows the user to sign out.

Figure 33:
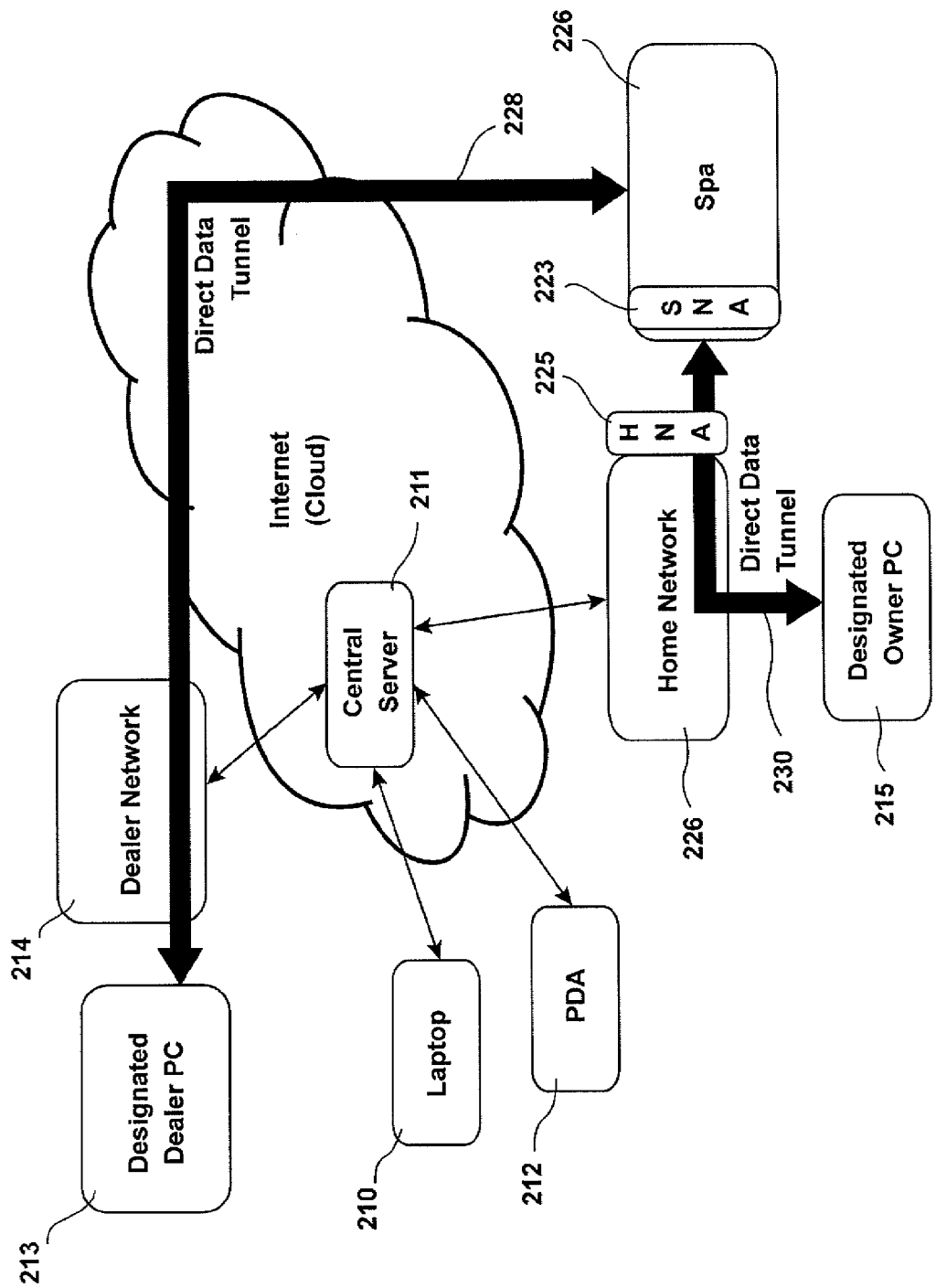
FIG. 33 illustrates an alternate spa networking embodiment employing direct data tunneling.

FIG. 33 illustrates an alternate spa networking embodiment employing direct data tunneling. The network of FIG. 33 includes a designated owner PC 215, a home network 226, an HNA 225, an SNA 223, a spa 226, a central server 211, a dealer network 214, a designated dealer PC 213, and optional laptop 210 and PDA 212. As in the embodiment of FIG. 3, each HNA 225 has a unique MAC (media access control) address which enables the dealer to send commands directly to the HNA through the Internet. In the embodiment of FIG. 33, the designated owner PC may communicate directly to the HNA through a direct data tunnel to the SNA 223. In this embodiment, the HNA 225 may open a secure socket (direct data tunnel) to either the designated owner PC or a designated dealer PC. An application program, for example, running on the dealer's computer 213 or the homeowner's computer 215 determines whether a particular communication goes to the central server 211 or to the SNA/spa 223. A type of communication which would go straight from the owner PC 215 to the SNA/spa via a secure socket direct data tunnel would be, for example, a jet pump control signal, whereas data dumps regarding the spa status, for example, would be communicated to the server 211, such as, for example, error conditions, and operating status of the spa.

Figure 34:
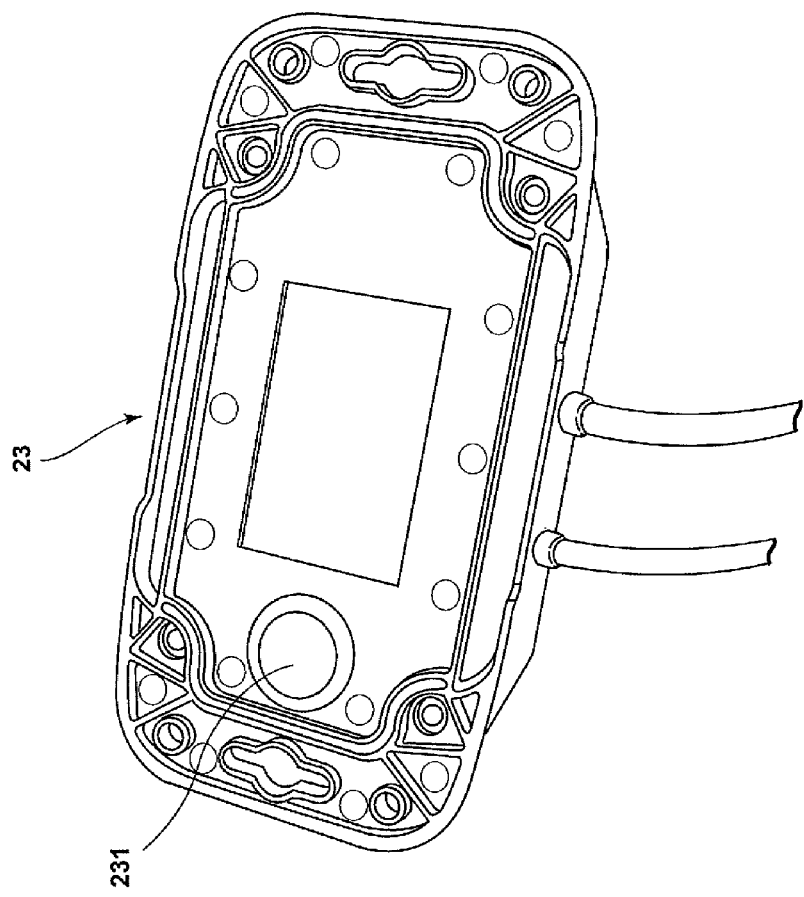
FIG. 34 illustrates a spa network adapter embodiment employing a "join mode" of operation.

FIG. 34 illustrates the back surface of an SNA embodiment particularly illustrating a "join mode" switch or button 231. This button 231 and attendant circuitry within the SNA enables field replacement of an SNA while still maintaining network security. When a new SNA is installed into the network, the join switch is depressed, which advises the HNA of the SNA's new address and invites the HNA to join the network using that new address and to thereafter exclude communication with any other address other than the address of the newly installed SNA. Once this network configuration communication has occurred, when the network is again powered up, the network operates in a normal state where the HNA and SNA only communicate with the designated new network address, thereby maintaining network security.

In one embodiment, the dealer and/or homeowner computers can collect, i.e., download, the application software necessary to participate in the system from the server 111 or elsewhere in the computing "cloud." For example, upon dealer log-in, the server 111 may send the dealer computer 113 the cookies it needs to work with the system and the subsequent processes includes fetching a table of the MAC addresses of the users with whom that dealer is authorized to communicate. Such MAC addresses are then used, for example, when the dealer seeks to access a user HNA 25 in order to perform a test on that user's particular spa or to exercise other control functions. Accessing of the application software in this fashion avoids the necessity for the dealers and users to install applications using hard disc (CDs, etc.).

In various embodiments, the PSA 21 may be mounted adjacent the spa controller 10 or control box 13, or integrated into the spa controller 13. likewise, the SNA 23 could be integrated into the controller or control box 13 and could comprise, in one embodiment, a wireless hub separate from the PSA 21 which hub could be configured to communicate with other devices such as an intrusion alarm, spa cover sensors, exterior lighting modules or other componentry.

Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

The invention claimed is:

1. Apparatus located at a single spa user site and comprising:
   a spa controller at the user site configured to control operation of a plurality of spa components and to generate status data regarding the status of one or more of said components;
   a power sense unit at the user site configured to compute power being drawn by one or more selected spa components and having a first wireless transceiver;
   a spa network adapter at the user site configured to communicate with said spa controller to receive data from said spa controller and to transmit data and commands to said spa controller, the spa network adapter having a second wireless transceiver;

the spa network adapter further being configured to receive power data computed by said power sense unit and transmitted over a wireless link between said first and second wireless transceivers;

a home network adapter at the user site having a third wireless transceiver and configured to receive data transmitted from said spa network adapter over a wireless link between said second and third wireless transceivers and to convert said data to a form suitable for transmission to an Internet access point;

wherein the spa network adapter is further configured to transmit both the power data and the status data received from the spa controller over a wireless link between said second and third wireless transceivers to said home network adapter; and wherein the spa controller is configured to signal the spa network adapter that the spa controller is about to turn "on" a selected spa component; and wherein the spa network adapter is configured to respond to said signal from the spa controller to communicate with the power sense unit to cause the power sense unit to sense the incremental increase in power drawn by the selected spa component when activated.

2. The apparatus of claim 1 wherein said home network adapter is linkable over the Internet to a central server, a dealer computer and/or a spa owner or user computer.

3. The apparatus of claim 2 wherein the spa network adapter is configured to signal the power sense unit to take power readings before and after activation of the selected spa component to determine the power drawn by the selected spa component.

4. The apparatus of claim 3 wherein the selected spa component is one of a spa heater or a spa jet pump.

5. The apparatus of claim 1 wherein the transmitted power data comprises a measurement of electrical current.

6. The apparatus of claim 3 wherein the transmitted power data comprises a measurement of electrical current.

7. Apparatus located at a spa user site comprising:
a spa controller at a spa user site configured to control operation of a plurality of spa components and to generate status data regarding the status of one or more of said components;

a power sense unit at a spa user site configured to compute power being drawn by one or more selected spa components and having a first wireless transceiver;

a spa network adapter at a spa user site configured to communicate with said spa controller to receive data from said spa controller and to transmit data and commands to said spa controller, the spa network adapter having a second wireless transceiver;

the spa network adapter further being configured to receive power data computed by said power sense unit and transmitted over a wireless link between said first and second wireless transceivers;

a home network adapter at a spa user site having a third wireless transceiver and configured to receive data transmitted from said spa network adapter over a wireless link between said second and third wireless transceivers and to convert said data to a form suitable for transmission to an Internet access point;

wherein the spa network adapter is further configured to transmit both the power data and the status data received from the spa controller over a wireless link between said second and third wireless transceivers to said home network adapter; and wherein the spa network adapter is further configured to acquire power "off" data concerning a selected spa component and to then signal the spa controller that said power "off" data has been acquired, whereafter the spa controller is configured to turn "on" the selected spa component and to signal the spa network adapter that it has turned on the selected spa component, whereafter the spa network adapter is configured to obtain power "on" data from the power sense unit.

8. The apparatus of claim 7 wherein the spa network adapter transmits the power "on" data to the home network adapter.

9. The apparatus of claim 8 wherein the home network adapter thereafter transmits the power "on" data to a central server.

10. The apparatus of claim 7 wherein the selected spa component is one of a spa heater or a spa jet pump.

11. The apparatus of claim 7 wherein said power data comprises a measurement of electrical current.

12. The apparatus of claim 10 wherein said power data comprises a measurement of electrical current.

13. Apparatus located at a single user site comprising:
a spa controller at the user site comprising of one or more microprocessors or microcontrollers configured to control operation of a plurality of spa components and to generate status data regarding the status of one or more of said components, the controller being configured to switch on or off one or more of a spa jet pump and a spa circulation pump;

a power sense unit at the user site comprising one or more current sensors operatively connected to a power sub-panel or breaker box, a microprocessor, and a first wireless transceiver, the power sense unit being configured to compute the amount of current being drawn by a selected spa component;

a spa network adapter at the user site configured to communicate with said spa controller to receive data from said spa controller and to transmit data and commands to said spa controller, the spa network adapter comprising a second wireless transceiver and a microcontroller;

the spa network adapter at the user site further being configured to receive current measurement data generated by said power sense unit and transmitted over a wireless link between said first and second wireless transceivers;

a home network adapter at the user site comprising a third wireless transceiver and a microcontroller and configured to receive data transmitted from said spa network adapter over a wireless link between said second and third wireless transceivers and to convert said data to a form suitable for transmission to an Internet access point;

wherein the spa network adapter is further configured to transmit both current measurement data generated by the power sense unit and spa status data received from the spa controller over a wireless link between said second and third wireless transceivers to said home network adapter; and wherein the spa network adapter communicates with the power sense unit to cause the power sense unit to sense the incremental increase in current drawn by a selected spa component by acquiring power "off" current measurement data concerning the selected spa component and then, signaling the spa controller that said power "off" current measurement data has been acquired, whereafter the spa controller is configured to turn "on" the selected spa component and to thereafter signal the spa network adapter that it has turned on the selected spa component, whereafter the spa network adapter is configured to obtain power "on" current measurement data from the power sense unit;

wherein the spa network adapter transmits current measurement data to the home network adapter; and wherein the home network adapter thereafter transmits the current measurement data to a central server.

14. The apparatus of claim 13 wherein the selected spa component is one of a spa heater or a spa jet pump.

* * * * *